United States Patent
Abe

(10) Patent No.: US 10,680,137 B2
(45) Date of Patent: Jun. 9, 2020

(54) ELECTRONIC DEVICE HAVING AN INTERMEDIATE LAYER DISPOSED BETWEEN TWO ELECTRICALLY-CONDUCTIVE LAYERS

(71) Applicant: JOLED INC., Tokyo (JP)

(72) Inventor: Yuuki Abe, Tokyo (JP)

(73) Assignee: JOLED INC., Tokyo (JP)

( * ) Notice: Subject to any disclaimer, the term of this patent is extended or adjusted under 35 U.S.C. 154(b) by 386 days.

(21) Appl. No.: 15/118,979

(22) PCT Filed: Feb. 19, 2015

(86) PCT No.: PCT/JP2015/000786
§ 371 (c)(1),
(2) Date: Aug. 15, 2016

(87) PCT Pub. No.: WO2015/129212
PCT Pub. Date: Sep. 3, 2015

(65) Prior Publication Data
US 2017/0054058 A1    Feb. 23, 2017

(30) Foreign Application Priority Data

Feb. 26, 2014  (JP) ................................ 2014-035139

(51) Int. Cl.
*H01L 27/32*    (2006.01)
*H01L 33/42*    (2010.01)
(Continued)

(52) U.S. Cl.
CPC .............. *H01L 33/42* (2013.01); *H01L 24/05* (2013.01); *H01L 27/3248* (2013.01);
(Continued)

(58) Field of Classification Search
CPC ........................ H01L 27/3248; H01L 27/3279
See application file for complete search history.

(56) References Cited

U.S. PATENT DOCUMENTS

| 5,443,922 A | 8/1995 | Nishizaki et al. |
| 5,534,462 A | 7/1996 | Fiordalice et al. |

(Continued)

FOREIGN PATENT DOCUMENTS

| JP | 04-010426 | 1/1992 |
| JP | 05-102108 | 4/1993 |

(Continued)

OTHER PUBLICATIONS

International Search Report, dated Apr. 21, 2015, for International Application No. PCT/JP2015/000786.

*Primary Examiner* — Shaun M Campbell
*Assistant Examiner* — Suberr L Chi
(74) *Attorney, Agent, or Firm* — Greenblum & Bernstein, P.L.C.

(57) ABSTRACT

An electronic device including: a substrate; a first electrically-conductive layer; a second electrically-conductive layer; and an intermediate layer. The first electrically-conductive layer is disposed on the substrate and composed of aluminum or an aluminum alloy. The second electrically-conductive layer is spaced away from the first electrically-conductive layer. The intermediate layer is disposed between the first electrically-conductive layer and the second electrically-conductive layer, is in contact with both the first electrically-conductive layer and the second electrically-conductive layer, and contains aluminum and fluorine.

5 Claims, 17 Drawing Sheets

(51) Int. Cl.
*H01L 23/00* (2006.01)
*H01L 33/44* (2010.01)

(52) U.S. Cl.
CPC .......... *H01L 27/3276* (2013.01); *H01L 33/44* (2013.01); *H01L 2224/04042* (2013.01); *H01L 2224/48453* (2013.01); *H01L 2224/48465* (2013.01); *H01L 2924/13055* (2013.01); *H01L 2924/13091* (2013.01); *H01L 2933/0016* (2013.01); *H01L 2933/0025* (2013.01)

(56) References Cited

U.S. PATENT DOCUMENTS

2005/0012694 A1* 1/2005 Park .................. G09G 3/3233
 345/76
2012/0032165 A1* 2/2012 Bae .................. H01L 21/02381
 257/43

FOREIGN PATENT DOCUMENTS

| JP | 05-144948 | 6/1993 |
| JP | 05-163488 | 6/1993 |
| JP | 08-250595 | 9/1996 |
| JP | 11-145282 | 5/1999 |
| JP | 2008-311586 | 12/2008 |
| JP | 2010-256910 | 11/2010 |
| JP | 2011-243605 | 12/2011 |

* cited by examiner

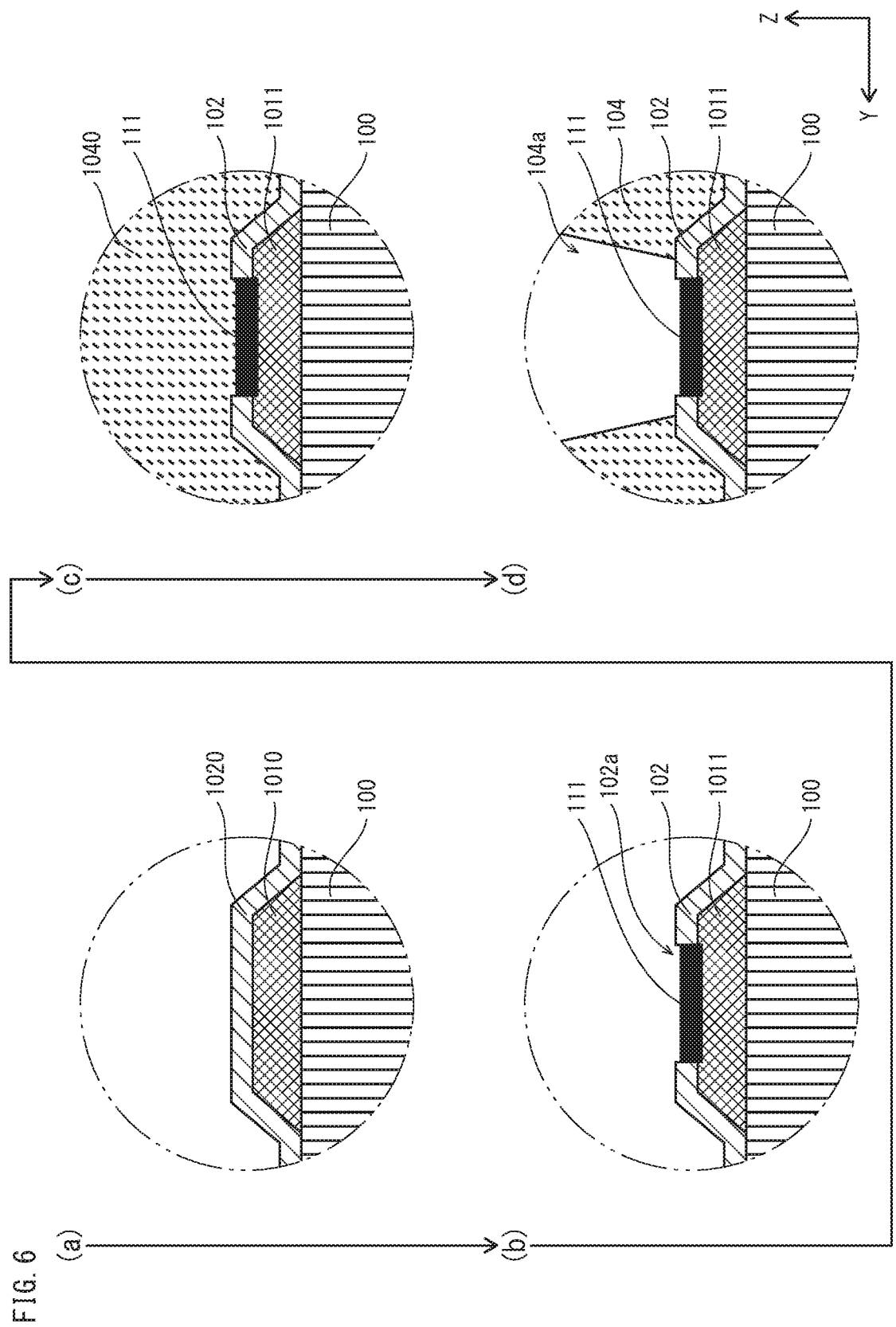

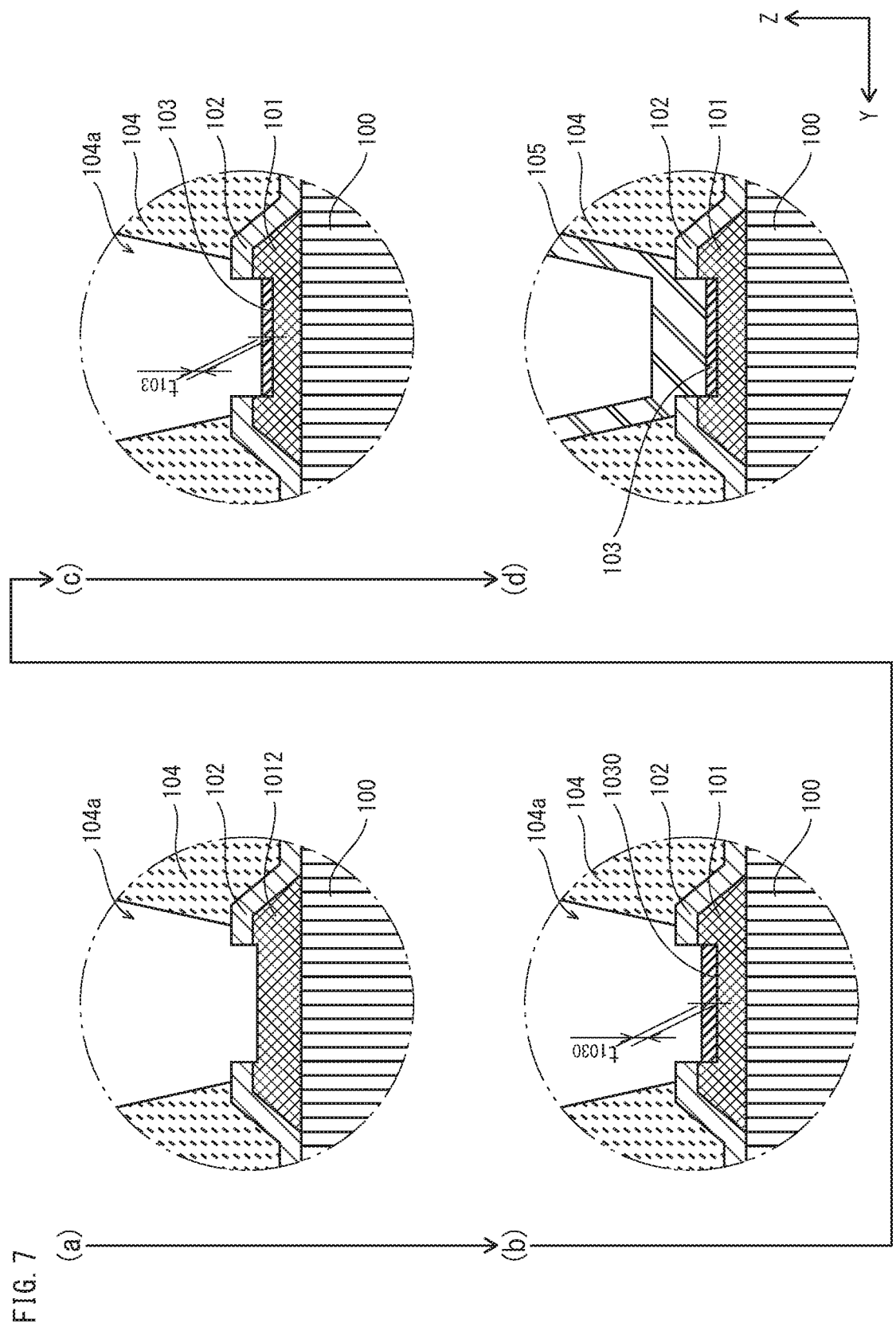

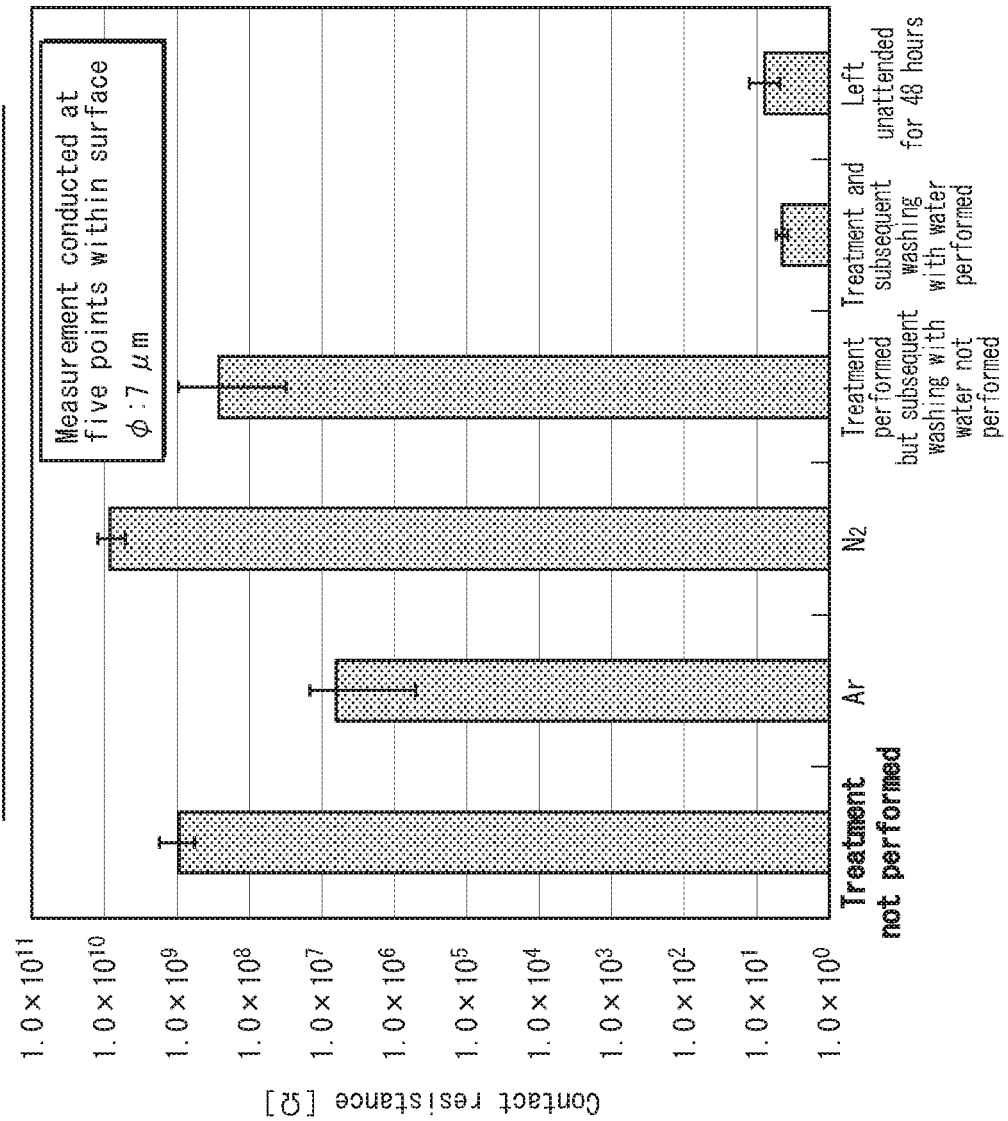

FIG. 9A  Process with dry etching but without subsequent washing
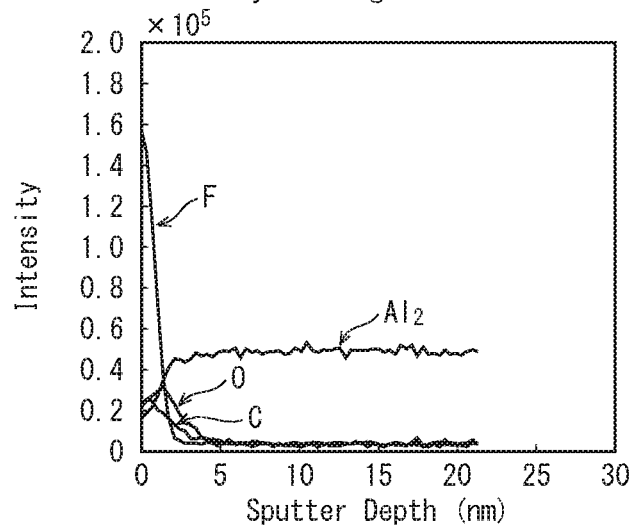
FIG. 9B  Process with dry etching and subsequent washing
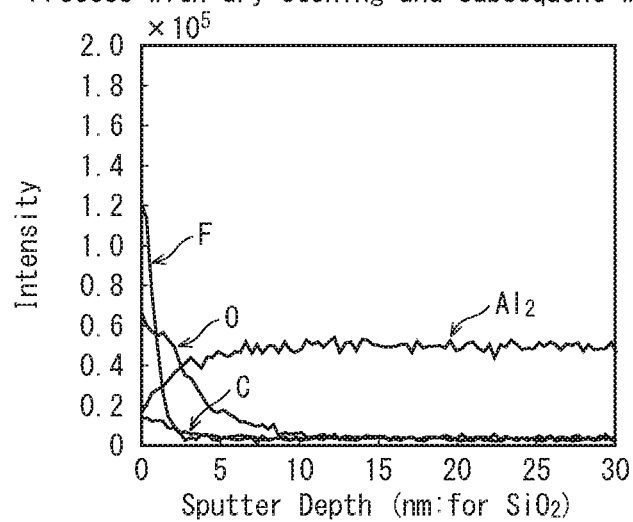
FIG. 9C  Without treatment
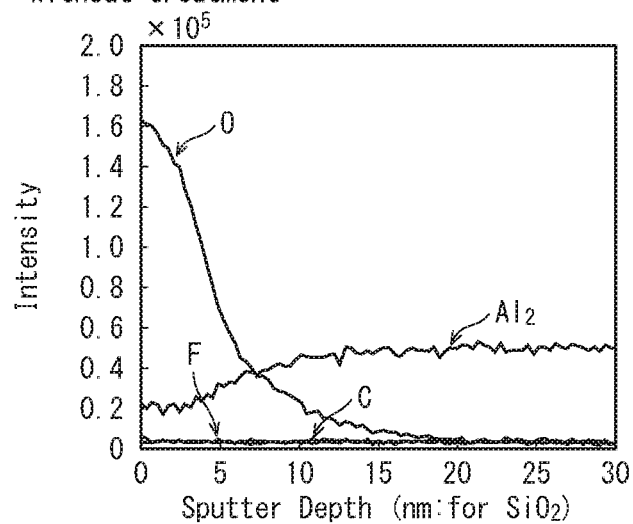

FIG. 10A

| Sample No. | Dry etching conditions | | | | Washing performed? | Contact resistance |
|---|---|---|---|---|---|---|
| | Source | Bias | Press | Time | | |
| S01 | 500 W | 400 W | 5 mTorr | 5 sec | Yes | $1.03 \times 10^3$ Ω |
| S02 | 500 W | 400 W | 5 mTorr | 10 sec | Yes | $3.51 \times 10^0$ Ω |
| S03 | 500 W | 400 W | 5 mTorr | 15 sec | Yes | $2.84 \times 10^0$ Ω |
| S04 | 250 W | 200 W | 5 mTorr | 5 sec | Yes | $1.26 \times 10^5$ Ω |
| S05 | 250 W | 200 W | 5 mTorr | 15 sec | Yes | $6.42 \times 10^0$ Ω |
| S06 | 750 W | 500 W | 5 mTorr | 15 sec | Yes | $2.95 \times 10^0$ Ω |
| S07 | 500 W | 400 W | 5 mTorr | 15 sec | No | $1.42 \times 10^9$ Ω |
| S08 | 250 W | 200 W | 5 mTorr | 15 sec | No | $4.19 \times 10^9$ Ω |
| S09 | 250 W | 200 W | 5 mTorr | 10 sec | No | $4.58 \times 10^9$ Ω |
| S10 | 500 W | 400 W | 30 mTorr | 15 sec | Yes | $3.06 \times 10^4$ Ω |

FIG. 10B

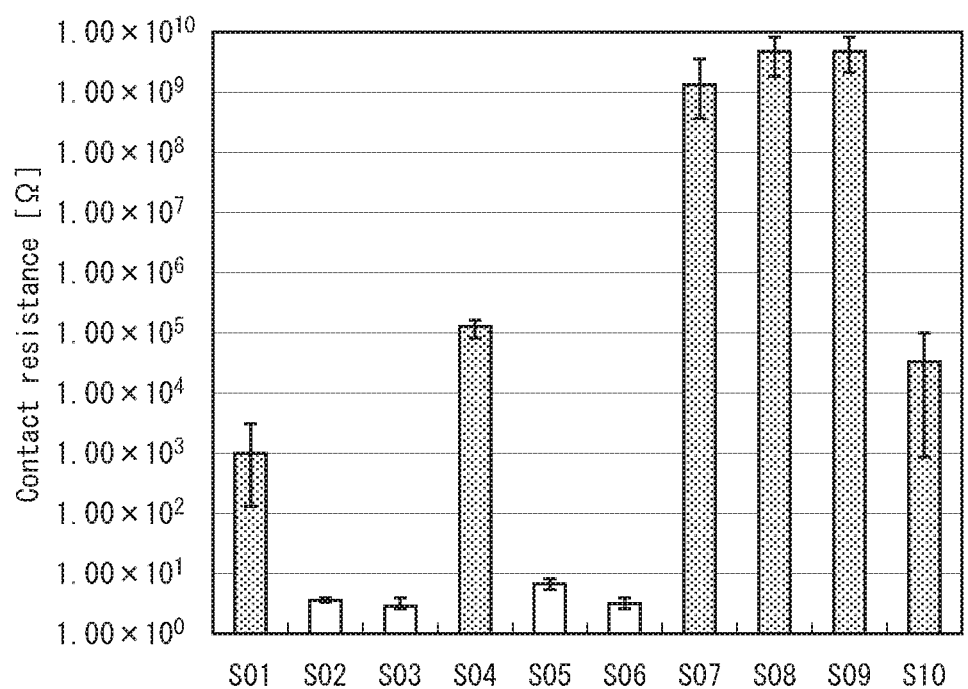

FIG. 12

| No. | Source | Bias | Press | CF$_4$ | O$_2$ | Time | Washing performed? | AES | | | |
|---|---|---|---|---|---|---|---|---|---|---|---|
| | | | | | | | | F | O | C | Al |
| 1 | 500 W | 400 W | 5 mTorr | 180 sccm | 20 sccm | 20 sec | No | 3.3 | 0.1 | 1.6 | 1.2 |
| 2 | | | | | | 20 sec | Yes | 2.8 | 0.3 | 1.3 | 1.2 |
| 3 | Without treatment | | | | | | | 1.0 | 1.0 | 1.0 | 1.0 |

ELECTRONIC DEVICE HAVING AN INTERMEDIATE LAYER DISPOSED BETWEEN TWO ELECTRICALLY-CONDUCTIVE LAYERS

TECHNICAL FIELD

The present invention relates to an electronic device and a manufacturing method for the electronic device, and in particular to an electronic device having an electrically-conductive layer containing aluminum or an aluminum alloy and a manufacturing method for such an electronic device.

BACKGROUND ART

Many electronic devices, such as display panels, have an electrically-conductive layer composed of aluminum or an aluminum alloy (hereinafter referred to as "Al or the like."). The following describes a structure of an organic electroluminescence (EL) panel as one example of an electronic device having an electrically-conductive layer composed of Al or the like, with reference to FIG. 16.

The conventional organic EL panel illustrated in FIG. 16G has thin film transistors (TFT) formed on a substrate 900 (In FIG. 16, only a drain electrode 901 and a barrier layer 902 among components of each TFT are illustrated). The drain electrodes 901 are composed of Al or the like, and the barrier layer 902 is composed of $Al_2O_3$ for example. The barrier layer 902 has an opening at a part thereof above each drain electrode 901. The barrier layer 902 prevents damage that may otherwise occur during a later-performed process of forming a planarizing layer 904.

The planarizing layer 904 is deposited on the barrier layer 902. The planarizing layer 904 has contact holes at positions corresponding to the openings of the barrier layer 902. On the planarizing layer 904, anodes 905 and a hole injection layer 906 are stacked in this order. One anode 905 is provided for each pixel, and an anode 905 for one pixel is separated from an anode 905 for another pixel. At a bottom portion of each contact hole, an anode 905 and a drain electrode 901 are electrically connected. In a top-emission-type organic EL panel, anodes 905 are composed of, for example, Al or the like, and have light-reflectivity.

On the hole injection layer 906, banks 907 defining openings each corresponding to one pixel are formed. The banks 907 are disposed to cover areas of the hole injection layer 906 located on the contact holes. In the openings defined by the banks 907, light-emitting layers 908 composed of an organic material are disposed.

The light-emitting layers 908 and the top surfaces of the banks 907 are covered by a cathode 909 that is continuous over the entire panel. The cathode 909 is covered by a sealing layer 910. The cathode 909 is formed, for example, by using indium tin oxide (ITO) or indium zinc oxide (IZO).

In the conventional organic EL panel illustrated in FIG. 16, each light-emitting layer 908 receives injection of holes supplied from one drain electrode 901 via an anode 905, and receives injection of electrons supplied from the cathode 909, and the amount of holes and electrons supplied to the organic light-emitting layers 908 is in accordance with pixel light-emission luminance. The holes and electrons recombine in the light-emitting layer 908, whereby the pixel including the light-emitting layer 908 emits light.

CITATION LIST

Patent Literature

[Patent Literature 1]
  Japanese Patent Application Publication No. 2011-243605
[Patent Literature 2]
  Japanese Patent Application Publication No. 2008-311586

SUMMARY OF INVENTION

Technical Problem

However, due to the drain electrode 901 of each TFT being composed of Al or the like in the conventional technology described above, an aluminum oxide ($AlO_x$) film 911 is formed at a surface portion of the drain electrode 901 in an area where the drain electrode 901 and an anode 905 are electrically connected, as illustrated in FIG. 17. The presence of this $AlO_x$ film 911 between the drain electrode 901 and the anode 905 renders the electrical resistance between the drain electrode 901 and the anode 905 high, due to the low electrical conductivity of the $AlO_x$ film 911. Thus, in the conventional organic EL panel with the above-described structure, not much holes are supplied from the drain electrode 901 to the anode 905, which results in the conventional organic EL panel having low performance (i.e., low light-emission performance).

Meanwhile, in a typical TFT having a drain electrode (drain electrode 901) composed of Al or the like, it is common to cover the surface of the drain electrode with a film of molybdenum (Mo) or the like. However, this film, particularly when having a small thickness, may disappear when providing the TFT with an opening for contact.

This problem is prone to occur not only with TFTs, but rather may occur similarly in any electrical connection between an electrically-conductive body composed of Al or the like and another electrically-conductive body.

In order to solve the above-described problem, the present invention aims to provide an electronic device in which the resistance of the electrical connection between an electrically-conductive layer composed of Al or the like and another electrically-conductive body is low, and a manufacturing method for such an electronic device.

Solution to Problem

One aspect of the present invention is an electronic device including: a substrate; a first electrically-conductive layer; a second electrically-conductive layer; and an intermediate layer. The first electrically-conductive layer is disposed on the substrate and is composed of aluminum or an aluminum alloy. The second electrically-conductive layer is spaced away from the first electrically-conductive layer.

The intermediate layer is disposed between the first electrically-conductive layer and the second electrically-conductive layer, is in contact with both the first electrically-conductive layer and the second electrically-conductive layer, and contains aluminum and fluorine.

Advantageous Effects of Invention

In the electronic device pertaining to one aspect of the present invention, the intermediate layer is disposed between the first electrically-conductive layer and the second electrically-conductive layer, is in contact with both the first electrically-conductive layer and the second electrically-conductive layer, and contains aluminum and fluorine. Accordingly, even though the first electrically-conductive layer is composed of Al or the like, resistance of the electrical connection between the first electrically-conductive layer and the second electrically-conductive layer is low.

BRIEF DESCRIPTION OF DRAWINGS

FIG. 6 includes schematic cross-sectional views in (a)-(d) illustrating procedures for electrically-connecting the drain electrode 101 and the anode 105, in the order they are performed.

FIG. 7 includes schematic cross-sectional views in (a)-(d) illustrating procedures for electrically-connecting the drain electrode 101 and the anode 105, in the order they are performed.

FIG. 8 is a characteristic graph illustrating a relationship between pre-connection treatment and contact resistance.

FIG. 9A is a characteristic graph illustrating a ratio between elements for a process where washing is not performed after dry etching (D/E), FIG. 9B is a characteristic graph illustrating a ratio between elements for a process where washing is performed after D/E, and FIG. 9C is a characteristic graph illustrating a ratio between elements without treatment.

FIG. 10A is a table illustrating, for each sample, a D/E condition, whether or not washing is performed, and contact resistance, and FIG. 10B is a characteristic graph illustrating contact resistance of each sample.

FIG. 12 is a table illustrating AES integrated intensity ratios for three samples, including two samples differing in terms of whether washing after D/E is performed, and a sample without treatment.

FIG. 113B is a characteristic graph illustrating, for each of the three samples, a relationship between a "Baseline" value and an AES(O) value.

DESCRIPTION OF EMBODIMENTS

Aspects of Present Invention

Figure 1:
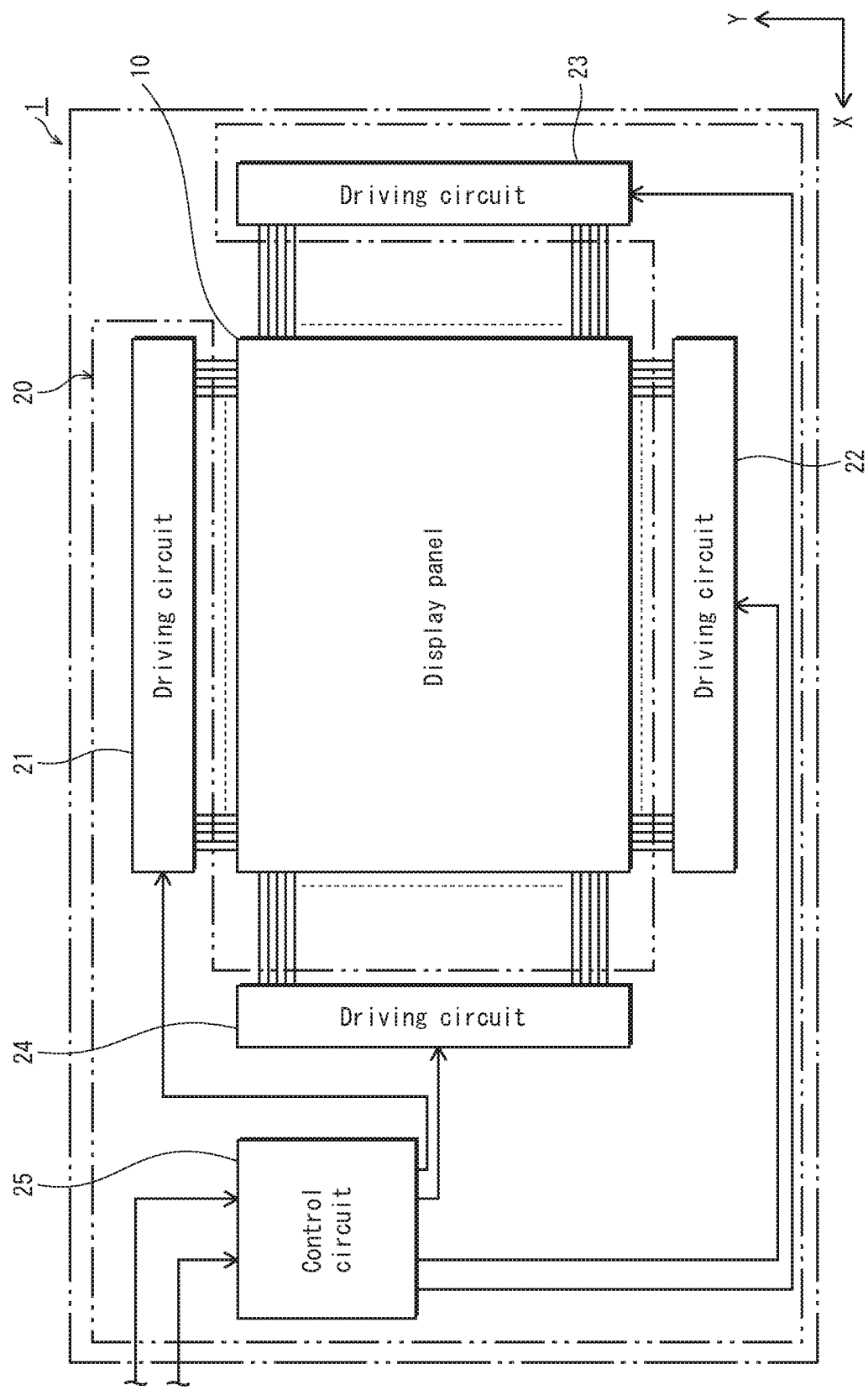
FIG. 1 is a schematic block diagram illustrating the structure of a display device 1 pertaining to an embodiment of the present invention.

One aspect of the present invention is an electronic device including: a substrate; a first electrically-conductive layer; a second electrically-conductive layer; and an intermediate layer. The first electrically-conductive layer is disposed on the substrate and is composed of aluminum or an aluminum alloy. The second electrically-conductive layer is spaced away from the first electrically-conductive layer.

The intermediate layer is disposed between the first electrically-conductive layer and the second electrically-conductive layer, is in contact with both the first electrically-conductive layer and the second electrically-conductive layer, and contains aluminum and fluorine.

In the electronic device pertaining to one aspect of the present invention, the intermediate layer further contains oxygen. Further, when considering a comparative device formed by: forming, on a substrate, a third electrically-conductive film having the same composition as the first electrically-conductive layer; forming a fourth electrically-conductive layer by patterning the third electrically-conductive film by using a gas containing fluorine; and causing a surface of the fourth electrically-conductive layer to undergo oxidization, to form an oxidization film containing fluorine, the electronic device pertaining to one aspect of the present invention satisfies the following relationships.

In the electronic device pertaining to one aspect of the present invention, in stoichiometric ratio, an oxygen content ratio of the intermediate layer is no higher than 0.25 times an oxygen content ratio of the oxidization film of the comparative device, and in stoichiometric ratio, a fluorine content ratio of the intermediate layer is no lower than 3.2 times a fluorine content ratio of the oxidization film of the comparative device.

In the electronic device pertaining to one aspect of the present invention, the intermediate layer has a thickness of 5 nm or less.

The electronic device pertaining to one aspect of the present invention further includes a barrier layer covering a surface of the first electrically-conductive layer, and the barrier layer covers the surface of the first electrically-conductive layer other than a part of the surface of the first electrically-conductive layer that is in contact with the intermediate layer.

The electronic device pertaining to one aspect of the present invention further includes an electrically-insulating layer deposited over the barrier layer to surround the intermediate layer, wherein the second electrically-conductive layer contacts the intermediate layer in an opening over the intermediate layer that is defined by the electrically-insulating layer.

In the electronic device pertaining to one aspect of the present invention, the second electrically-conductive layer is composed of aluminum or an aluminum alloy.

One aspect of the present invention is a method of manufacturing an electronic device, in which (a) through (h) described in the following are executed.

(a) forming, on a substrate, a first electrically-conductive layer composed of aluminum or an aluminum alloy (b) forming a barrier layer on a surface portion of the first electrically-conductive layer (c) removing a part of the barrier layer (d) forming an electrically-insulating layer over the barrier layer and an area where the part of the barrier layer has been removed (e) forming an opening in the electrically-insulating layer above the area where the part of the barrier layer has been removed (f) removing any aluminum oxide film that forms on a surface of the first electrically-conductive layer at the area where the part of the barrier layer has been removed, after the removing of the part of the barrier layer (c) is performed and before the forming of the opening in the electrically-insulating layer is completed (e)

(g) forming an intermediate layer at an area where the aluminum oxide film has been removed by doping the area with fluorine (h) forming a second electrically-conductive layer on the intermediate layer In the method pertaining to one aspect of the present invention, the intermediate layer contains aluminum and fluorine.

The method pertaining to one aspect of the present invention enables manufacturing an electronic device in which an intermediate layer containing aluminum and fluorine is disposed between the first electrically-conductive layer and the second electrically-conductive layer and in contact with both the first electrically-conductive layer and the second electrically-conductive layer. Accordingly, the method pertaining to one aspect of the present invention enables manufacturing an electronic device in which resistance of the electrical connection between the first electrically-conductive layer and the second electrically-conductive layer is low.

In the method pertaining to one aspect of the present invention, (c), (d), and (e) described above are performed through a same process.

In the method pertaining to one aspect of the present invention, the intermediate layer further includes oxygen.

The method pertaining to one aspect of the present invention in which (i) described in the following is performed in addition.

(i) performing a wet process to reduce the thickness of the intermediate layer to 5 nm or less Embodiment 1. Overall Structure of Display Device The following describes the overall structure of a display device 1 pertaining to an embodiment of the present invention, with reference to FIG. 1 and FIG. 2.

Figure 2:
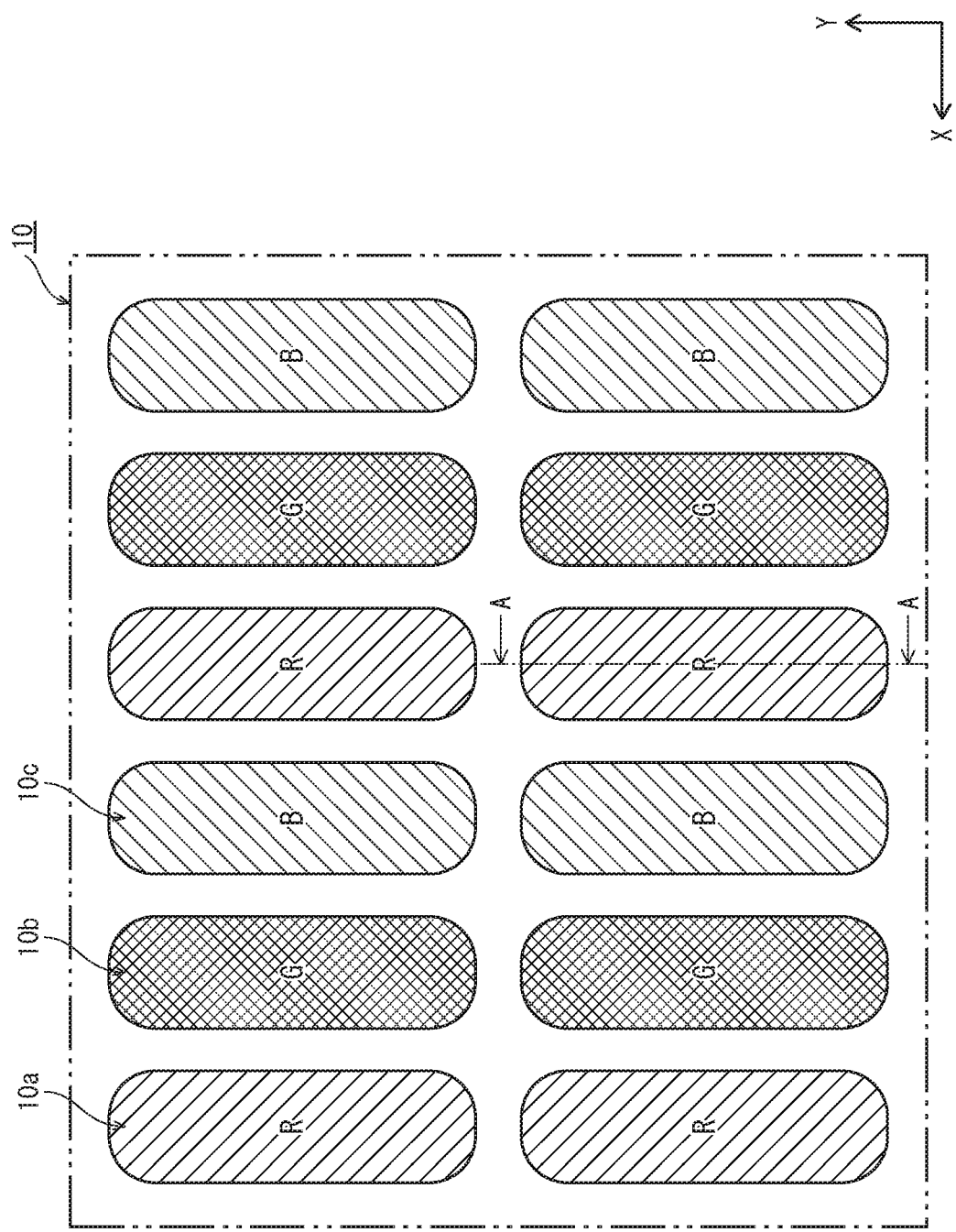
FIG. 2 is a schematic plan view illustrating the structure of a part of a display panel 10.

As illustrated in FIG. 1, the display device 1 includes a display panel 10 and a driving control unit 20 connected to the display panel 10. The display panel 10 is an organic EL panel that makes use of an electroluminescent phenomenon of an organic material, and includes a plurality of pixel units. As illustrated in FIG. 2, each pixel unit is composed of a red (R) light-emitting portion 10*a*, a green (G) light-emitting portion 10*b*, and a blue (B) light-emitting portion 10*c*. As illustrated in FIG. 2, the pixel units are arranged so as to form a matrix in the display panel 10.

The driving control unit 20 includes four driving circuits (namely driving circuits 21, 22, 23, 24) and a control circuit 25.

Note that in the display device 1, the driving control unit 20 and the display panel 10 need not be arranged with respect to one another as illustrated in FIG. 1.

Further, the pixel units need not be composed of three light-emitting portions respectively corresponding to the colors R, G, and B as illustrated in FIG. 2, and each may be composed of light-emitting portions of four or more colors.

2. Structure of Display Panel

Figure 3:
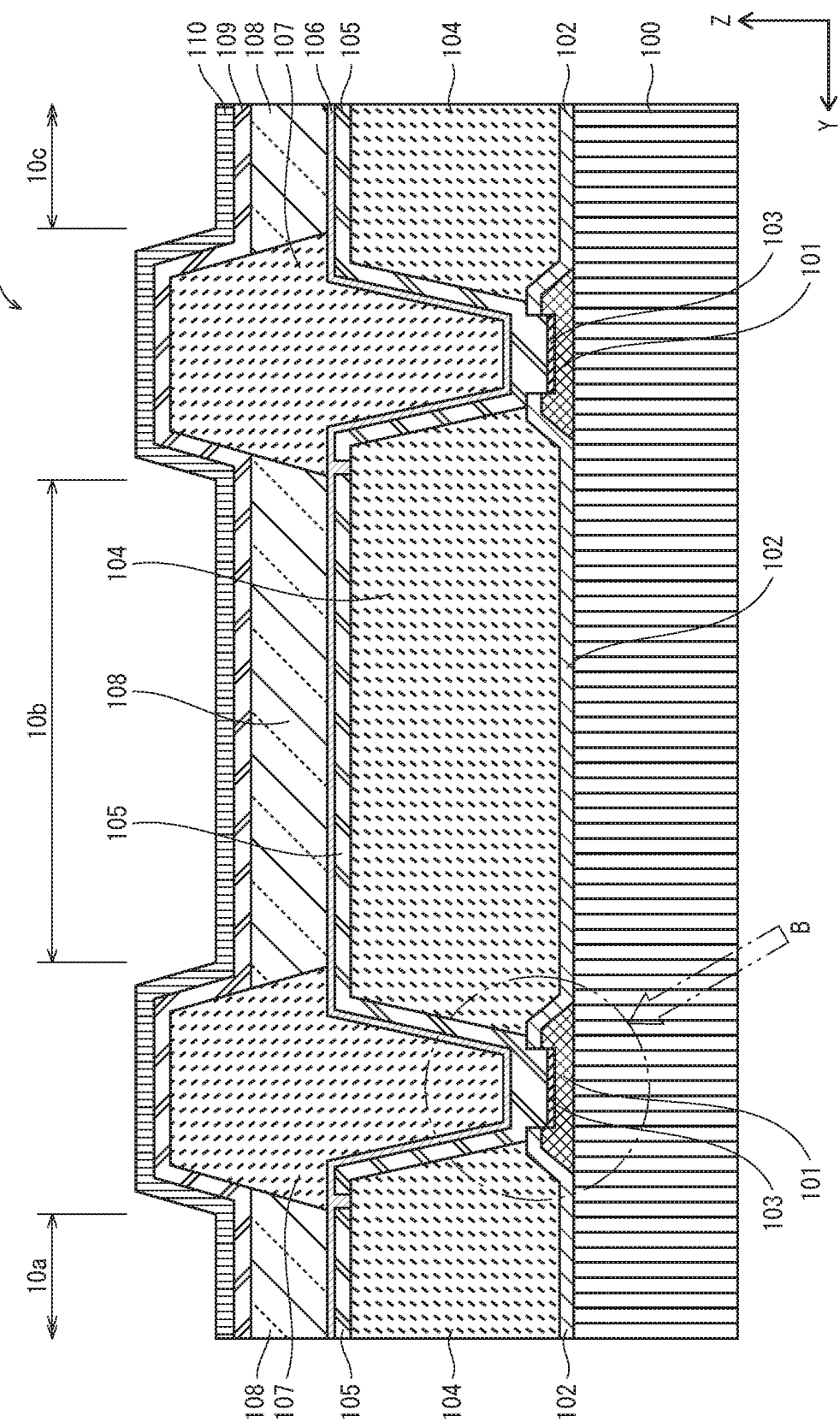
FIG. 3 is a schematic cross-sectional view illustrating the structure of a part of the display panel 10 (i.e., the structure of a cross-section taken along line A-A in FIG. 2).
Figure 4:
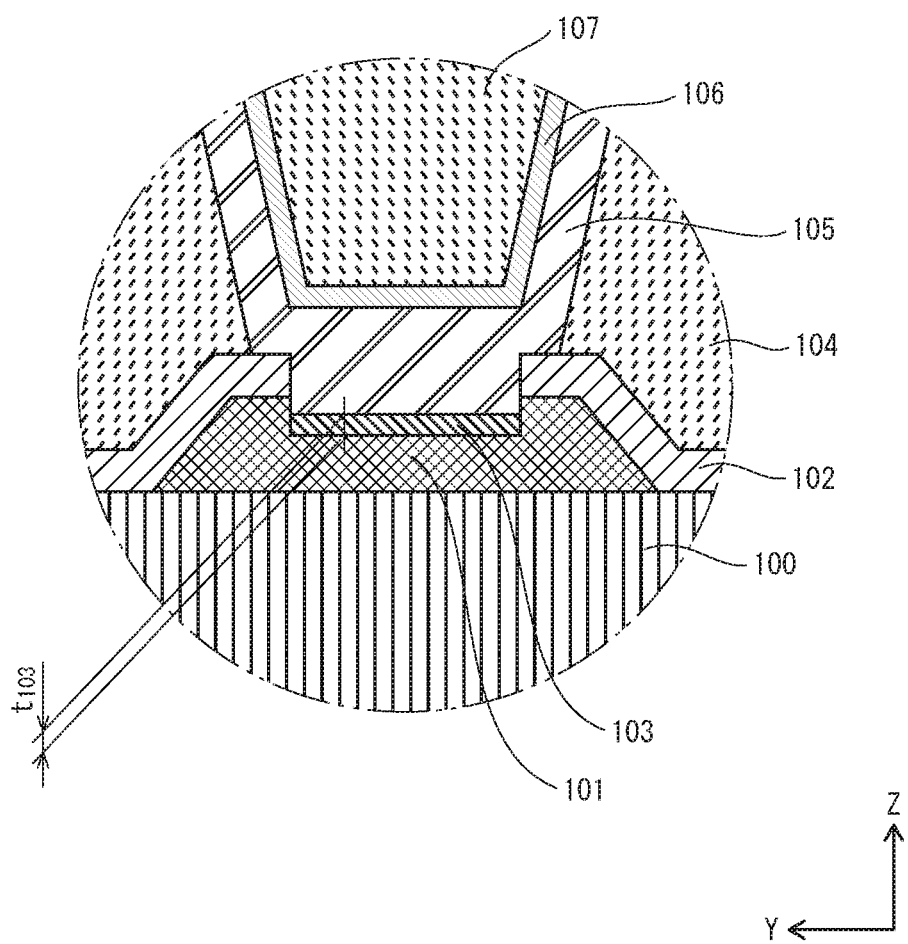
FIG. 4 is a schematic cross-sectional view illustrating, in magnified state, a part of the display panel 10 (a part indicated by arrow B in FIG. 3) where a drain electrode 101 and an anode 105 are electrically-connected.

The following describes the structure of the display panel 10, with reference to FIG. 3 and FIG. 4. The following description is an exemplary description provided presuming that the display panel 10 is a top-emission-type organic EL panel.

As illustrated in FIG. 3, the display panel 10 has TFTs disposed on a Z-direction upper surface of a substrate 100. Among components of each TFT, only a drain electrode 101 and a barrier layer 102 are illustrated in FIG. 3, which is a schematic. The barrier layer 102 has openings each exposing a part of an upper surface of a drain electrode 101.

On the barrier layer 102, a planarizing layer 104 composed of an electrically insulating material is disposed through deposition. The planarizing layer 104 has contact holes at portions corresponding to the openings in the barrier layer 102. Above a surface of the planarizing layer 104, anodes 105 and a hole injection layer 106 are disposed in this order.

At the bottom of each contact hole, an anode 105 is electrically-connected with a drain electrode 101 of one TFT, via an opening in the barrier layer 102. The anodes 105, formed through patterning, correspond one-to-one with light-emitting portions 10*a*, 10*b*, 10*c*. Meanwhile, one continuous hole injection layer 106 extends across the light-emitting portions 10*a*, 10*b*, 10*c*.

Note that in the display panel 10, an intermediate layer 103 is disposed between each anode 105 and a corresponding drain electrode 101, as illustrated in FIG. 4. The intermediate layer 103 is in contact with both the anode 105 and the drain electrode 101, and contains aluminum (Al), fluorine (F), and oxygen (O). Further, the intermediate layer 103 has a thickness $t_{103}$ of 5 nm or less.

On the hole injection layer 106, banks 107 composed of an electrically insulating material are disposed to stand. The banks 107 separate the light-emitting portions 10*a*, 10*b*, 10*c* from one another, and defines openings corresponding one-to-one with the light-emitting portions 10*a*, 10*b*, 10*c*.

Each of the openings has one light-emitting layer 108 composed of an organic material disposed therein. On the light-emitting layer 108, a cathode 109 and a sealing layer 110 are disposed. The cathode 109 and the sealing layer 110 continuously extend across the light-emitting portions 10*a*, 10*b*, 10*c*.

3. Components

For example, the components of the display panel 10 are formed by using the materials described in the following.

<Substrate 100>

For example, the substrate 100 is formed by using, as a base material, an electrically insulating material such as alkali-free glass, soda glass, nonfluorescent glass, phosphate glass, borate glass, quartz, acrylic resin, styrenic resin, polycarbonate resin, epoxy resin, polyethylene, polyester, silicone resin, or alumina.

<Drain Electrodes 101>

For example, the drain electrodes 101 are composed of aluminum (Al) or an Al alloy. One example of a usable Al alloy is an Al—Co (aluminum-cobalt) alloy.

<Barrier Layer 102>

For example, the barrier layer 102 is composed of aluminum oxide ($Al_2O_3$), silicon nitride (SiN), or silicon oxide ($SiO_x$).

<Intermediate Layer 103>

As described above, the intermediate layer 103 contains aluminum (Al), fluorine (F), and oxygen (O).

<Planarizing Layer 104>

For example, the planarizing layer 104 is formed by using an organic compound such as polyimide, polyamide, or an acrylic resin.

<Anodes 105>

The anodes 105 are either composed of a single layer composed of an electrically-conductive material, or composed of two or more layers stacked on one another. For example, the anodes 105 are formed by using aluminum (Al) or an alloy containing Al, silver (Ag), APC (alloy of silver, palladium, and copper), ARA (alloy of silver, rubidium, and gold), MoCr (alloy of molybdenum and chromium), or NiCr (alloy of nickel and chromium). In particular, in a top-emission-type panel, the anodes 105 are beneficially formed by using a material with high optical reflectivity.

Additionally, each anode 105 may have, at an upper portion thereof, a light-transmissive coating layer formed by using indium tin oxide (ITO), for example.

<Hole Injection Layer 106>

For example, the hole injection layer 106 is composed of an oxide of a metal such as silver (Ag), molybdenum (Mo), chromium (Cr), vanadium (V), tungsten (W), nickel (Ni), or iridium (Ir), or an electrically-conductive polymer material such as polyethylenedioxythiophene (PEDOT; mixture of polythiophene and polystyrene sulfonic acid). The hole injection layer 106, when composed of a metal oxide among the materials described above, has a great work function, and assists the generation of holes and stably transports and injects holes to the light-emitting layers 108.

Further, the hole injection layer 106, when composed of an oxide of a transition metal, has multiple energy levels due to oxides of transition metals having multiple oxidation states. This results in the hole injection layer 106 readily performing hole injection and thus achieving a reduction in driving voltage.

<Banks 107>

The banks 107, being formed by using an electrically insulating organic material such as a resin, are electrically insulating. For example, the banks 107 may be formed by using an organic material such as an acrylic resin, a polyimide resin, or a novolac type phenolic resin. Further, it is desirable that the banks 107 have resistance against organic solvents.

Further, in the forming of the banks 107, treatments such as etching and baking are typically performed. Taking this into account, the banks 107 are beneficially formed by using a material having high resistance and thus does not undergo excessive deformation, deterioration, and the like in such treatments. In addition, the banks 107 may be provided with water repellency by treating lateral surface portions of the banks 107 with fluorine.

Note that the banks 107 may be formed by using an electrically insulating material, including but not limited to those described above, that has an electrical resistivity of $10^5$ Ω·cm or greater and has liquid repellency. Using a material having an electrical resistivity of $10^5$ Ω·cm or greater is beneficial because using a material having an electrical resistivity $10^5$ Ω·cm or less results in current leakage occurring between the anodes 105 and the cathode 109 and/or between the light-emitting portions 10a, 10b, 10c, which are adjacent to one another. Such current leakage leads to various problems, such as an increase in power consumption.

Meanwhile, using a material having liquid repellency is beneficial because using a liquid-philic material results in a small difference between the lateral surfaces of the banks 107 and the surface of the hole injection layer 106 in terms of liquid philicity/liquid repellency, and thus, a difficulty arises in having ink containing an organic substance for forming the light-emitting layers 108 to stay selectively within the openings defined by the banks 107.

Further, the banks 107 need not be composed of a single layer as illustrated in FIG. 3, and instead may be composed of two or more layers. When configuring the banks 107 to have such a multi-layer structure, the layers may each contain a combination of the materials described above, or the layers may include one or more layers containing inorganic material and one or more layers containing organic material.

<Light-Emitting Layers 108>

The light-emitting layers 108 emit light when put in excitation state by holes injected from the anodes 105 and electrons injected from the cathode 109 recombine therein. The light-emitting layers 108 are beneficially formed by using an organic material which has a light-emitting property and a film of which can be formed through wet printing.

For example, the light-emitting layers 108 are formed by using one of the fluorescent materials disclosed in Japanese Patent Application Publication No. H05-163488, which include: an oxinoid compound; a perylene compound; a coumarin compound; an azacoumarin compound; an oxazole compound; an oxadiazole compound; a perinone compound; a pyrrolo-pyrrole compound; a naphthalene compound; an anthracene compound; a fluorene compound; a fluoranthene compound; a tetracene compound; a pyrene compound; a coronene compound; a quinolone compound and an azaquinolone compound; a pyrazoline derivative and a pyrazolone derivative; a rhodamine compound; a chrysene compound; a phenanthrene compound; a cyclopentadiene compound; a stilbene compound; a diphenylquinone compound; a styryl compound; a butadiene compound; a dicyanomethylene pyran compound; a dicyanomethylene thiopyran compound; a fluorescein compound; a pyrylium compound; a thiapyrylium compound; a selenapyrylium compound; a telluropyrylium compound; an aromatic aldadiene compound; an oligophenylene compound; a thioxanthene compound; a cyanine compound; an acridine compound; a metal complex of an 8-hydroxyquinoline compound; a metal complex of a 2-bipyridine compound; a complex of a Schiff base and a group III metal; a metal complex of oxine; and rare earth metal complex.

<Cathode 109>

For example, the cathode 109 is formed by using ITO or indium zinc oxide (IZO). In a top-emission-type panel, the cathode 109 is beneficially formed by using a light-transmissive material. Further, the light-transmissivity of the cathode 90 is beneficially 80% or higher.

Note that electron injection layers may be disposed between the light-emitting layers 108 and the cathode 109.

The electron injection layers so disposed transport electrons injected thereto from the cathode 109 to the light-emitting layers 108. For example, the electron injection layers are formed by using one or more materials selected from the group consisting of barium, phthalocyanine, and lithium fluoride.

<Sealing Layer 110>

The sealing layer 110 prevents the light-emitting layers 108 from being exposed to moisture, ambient air, etc. For example, the sealing layer 110 is formed by using SiN (silicon nitride) or SiON (silicon oxynitride). In a top-emission-type panel, the sealing layer is beneficially formed by using a light-transmissive material.

4. Effects

As described above, in the display panel 10 pertaining to the present embodiment, the anodes 105 are electrically connected to the drain electrodes 101, which are composed of Al or the like, with the intermediate layer 103 disposed between each anode 105 and a corresponding drain electrodes 101. The intermediate layer 103 contains Al, F, and O. Thus, contact resistance (i.e., the resistance of the electrical connection between the anode and the drain electrode) is lower when the intermediate layer 103 exists compared to the conventional structure illustrated in FIG. 17, where the $AlO_x$ film 911 exists between the anode and the drain electrode. Meanwhile, while description has been provided in the present embodiment that the intermediate layers 103 have a thickness of 5 nm or less, the intermediate layers 103 may have a thickness greater than 5 nm. However, in order to achieve low contact resistance, the smaller the thickness of the intermediate layers 103, the more beneficial. For example, 8 nm is more beneficial than 10 nm, 7 nm is more beneficial than 8 nm, and 6 nm is more beneficial than 7 nm.

Figure 17:
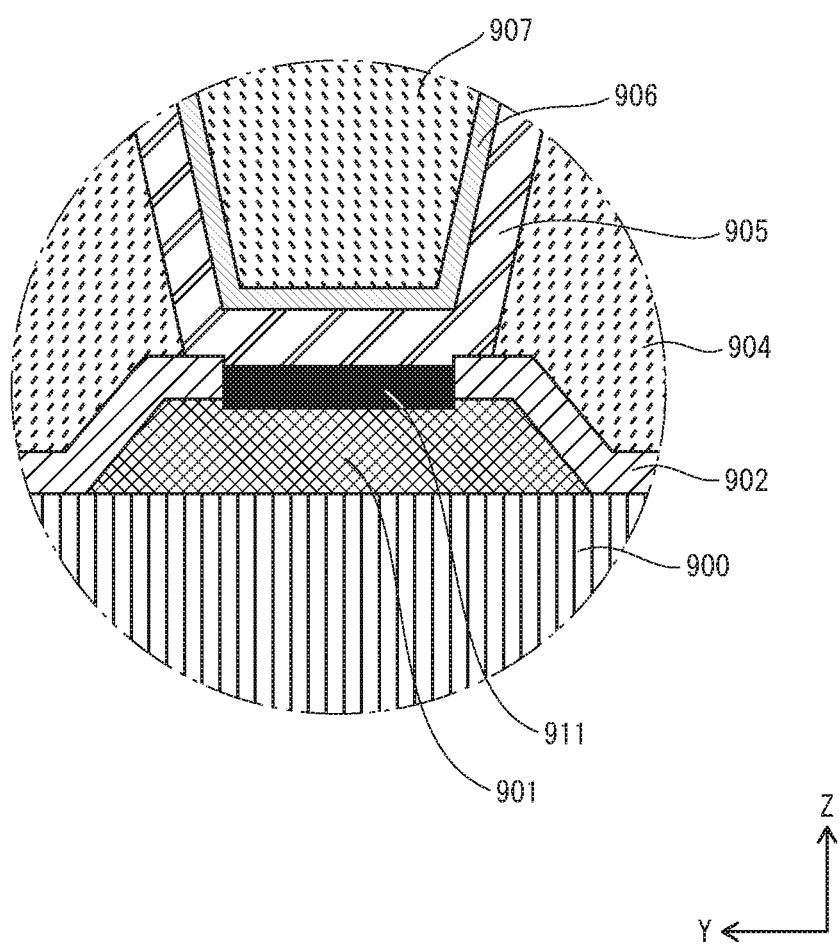
FIG. 17 is a cross-sectional view illustrating a state where an $AlO_x$ film 911 is disposed between a drain electrode 901 and an anode 905 in a display panel.

Further, in terms of stoichiometric ratio, an oxygen (O) content ratio of the intermediate layer 103 is no higher than 0.25 times an oxygen (O) content ratio of the $AlO_x$ film 911 illustrated in FIG. 17, and a fluorine (F) content ratio of the intermediate layer 103 is no lower than 3.2 times a fluorine (F) content ratio of the $AlO_x$ film 911 illustrated in FIG. 17.

Note that here, a presumption is made that the $AlO_x$ film 911 also contains a small amount of fluorine due to fluorine being introduced into an opening portion of the barrier layer 102 during dry etching.

5. Manufacturing Method

Figure 5:
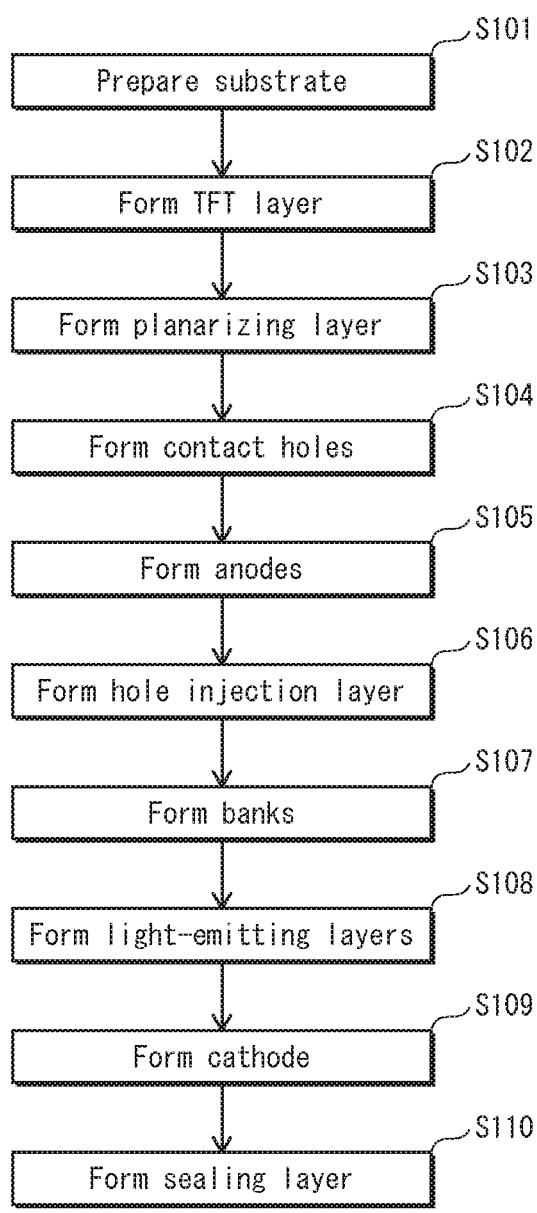
FIG. 5 is a flowchart illustrating an overview of a manufacturing process of the display panel 10.

The following describes a manufacturing method of the display panel 10 pertaining to the present embodiment, with reference to FIG. 5 in addition to FIG. 3.

First, the substrate 100 illustrated in FIG. 3 is prepared (S101 in FIG. 5). Then, the TFTs are formed on the Z-direction upper surface of the substrate 100 (S102 in FIG. 5). Among components of each TFT, only a drain electrode 101 and a barrier layer 102 are illustrated in FIG. 3.

After openings are formed in portions (contact areas) of the barrier layer 102, a film of an organic material such as acrylic resin or polyimide resin is formed on the barrier layer 102 through application of the organic material. Then, contact holes are formed in the organic material film at portions corresponding to the openings in the barrier layer 102 through photolithography or the like, whereby the planarizing layer 104 is formed (S103 and S104 in FIG. 5).

Next, a film of anode material is formed on the surface of the planarizing layer 104 through reactive sputtering or the like. This film is composed of aluminum (Al) or an Al alloy. Then, a resist film having a predetermined pattern is formed on the anode material film, and patterning according to a conventional photolithography method is performed, whereby the anodes 105 are formed (S105 in FIG. 5). In the patterning, wet etching may be performed, for example, by using as the etchant a solution prepared by mixing phosphoric acid and acetic acid.

Next, the hole injection layer 106, which for example is composed of tungsten oxide, is formed to cover surfaces of the anodes 105 through reactive sputtering (S106 in FIG. 5).

Then, a bank material layer is formed by depositing a bank material, which is for example a photosensitive resin material (fluorine resin material or the like), on the hole injection layer 106 and performing prebaking.

Subsequently, a photomask having a predetermined pattern is overlaid onto the bank material layer, parts of the bank material layer are exposed to light (e.g., ultraviolet light), and etching is performed, whereby the banks 107 are formed (S107 of FIG. 5). The etching for forming the banks 107 may be performed by using a tetramethylammonium hydroxide (TMAH) solution.

Next, drops of a composite ink containing organic light-emitting material are applied with respect to the openings defined by the banks 107, and the ink solvent is removed by causing the ink solvent to volatilize (S108 in FIG. 5), whereby the light-emitting layers 108 are formed.

Then, ITO or IZO is deposited onto the surfaces of the light-emitting layers 108 and the exposed surfaces of the banks 107 through vacuum vapor deposition, for example, whereby the cathode 109 is formed (S109 in FIG. 5). Subsequently, the sealing layer 110, which for example is composed of SiN or SiON, is formed on a surface of the cathode 109 (S110 in FIG. 5).

The display panel 10 is manufactured through the procedures described above.

Note that hole transport layers may be disposed between the hole injection layer 106 and the light-emitting layers 108, and electron transport layers and/or the like may be disposed between the light-emitting layers 108 and the cathode 109. The hole transport layers may be formed by applying drops of a composite ink containing an amine-based organic molecular material through a wet process, which may for example be ink jet printing or gravure printing, and then removing the ink solvent by causing the ink solvent to volatize.

The electron transport layers may be formed by forming a film composed of a material such as barium (Ba), phthalocyanine, or lithium fluoride through vacuum vapor deposition, for example.

The following describes in detail the procedures from the forming of a TFT (S102) to the forming of an anode 105 (S105), with reference to FIG. 6 and FIG. 7.

As illustrated in part (a) of FIG. 6, a drain electrode 1010 is formed on the main surface (i.e., the Z-axis direction upper surface) of the substrate 100, and a barrier layer 1020 is formed so as to cover the drain electrode 1010. The drain electrode 1010 is composed of an Al alloy, and the barrier layer 1020 is composed of, for example, $Al_2O_3$, SiN, or $SiO_x$. Note that patterning of the drain electrode 1010 is performed before the barrier layer 1020 is formed thereover. The patterning of the drain electrode 1010 is performed through wet etching or dry etching, for example.

Next, as illustrated in part (b) of FIG. 6, an opening is formed in the barrier layer 1020 at a part of the barrier layer 1020 above the drain electrode 1020, whereby the barrier layer 102 having an opening (i.e., an opening 102a) at a part thereof is formed. Here, as illustrated in part (b) of FIG. 6, an $AlO_x$ film 111 is formed in a drain electrode 1011 at a surface portion of the drain electrode 1011 that is exposed via the opening 102a.

Next, as illustrated in part (c) of FIG. 6, a planarizing layer 1040 is deposited over the entirety of the substrate 100. Then, as illustrated in part (d) of FIG. 6, a contact hole 104a is formed in the planarizing layer 1040 at a part of the planarizing layer 1040 above the drain electrode 1011. This results in the contact hole 104a in the planarizing layer 104 exposing, at the bottom thereof, the $AlO_x$ film 111.

Note that the procedure of forming the opening in the barrier layer 1020 (i.e., the procedure of forming the barrier layer 102 with the opening 102a) may be performed after the contact hole 104a in the planarizing layer 1040 has been formed.

Next, the workpiece yielded by performing the manufacturing processes illustrated in parts (a) through (d) of FIG. 6 is accommodated inside a chamber. Then, as illustrated in part (a) of FIG. 7, the $AlO_x$ film 111 is removed through dry etching. This results in a drain electrode 1012 without the $AlO_x$ film 111 being exposed at the bottom of the opening 104a of the planarizing layer 104. Here, the gas used in the dry etching may be a rare gas or a fluorine gas (e.g., $CF_4/O_2$).

Then, a fluorine gas is introduced into the chamber with the workpiece in the chamber to form an intermediate layer 1030 at a surface portion of the drain electrode 101, as illustrated in part (b) of FIG. 7. The intermediate layer 1030 contains aluminum (Al), fluorine (F), and oxygen (O), and has a thickness $t_{1030}$ of approximately 10 nm.

Subsequently, the workpiece with the intermediate layer 1030 is taken out from the chamber, and a wet process (e.g., washing with water) is performed to form the intermediate layer 103 with a thickness $t_{103}$ of 5 nm or less, as illustrated in part (c) of FIG. 7. At this point, due to the intermediate layer 103 being formed at the surface portion of the drain electrode 101, the drain electrode 101 is not exposed to the outside. Thus, even in ambient air, oxidization of the drain electrode 101 does not progress.

Following this, the anode 105 is formed as illustrated in part (d) of FIG. 7. As such, the intermediate layer 103 is disposed between the anode 105 and the drain electrode 101, and thus low contact resistance and excellent electrical connection between the anode 105 and the drain electrode 101 are achieved.

Observations

1. Pre-Connection Treatment and Contact Resistance

The following describes results of an experiment conducted regarding the relationship between pre-connection treatment and contact resistance, with reference to FIG. 8.

"Treatment not performed" in FIG. 8 indicates a sample yielded by forming an anode with respect to a workpiece in the state illustrated by part (d) of FIG. 6. "Ar" and "$N_2$" in FIG. 8 respectively indicate a sample yielded by performing dry etching with Ar, and a sample yielded by performing dry etching with $N_2$.

"Treatment performed but subsequent washing with water not performed" indicates a sample yielded by forming an anode with respect to a workpiece in the state illustrated by part (b) of FIG. 7, and "Treatment and subsequent washing with water performed" indicates a sample having the same structure as what is described above in the present embodiment, i.e. the state illustrated in part (d) of FIG. 7. "Left unattended for 48 hours" indicates a sample yielded by forming an anode after the work piece in the state illustrated in part (c) of FIG. 7 was left unattended for 48 hours.

As illustrated in FIG. 8, the contact resistance of the sample yielded by performing treatment but not performing the subsequent washing with water was approximately ½ the contact resistance of the sample yielded without performing treatment. Further, the contact resistance of the sample yielded by performing both treatment and the subsequent washing with water was $1/10^8$ of the contact resistance of the sample yielded without performing treatment.

Further, the contact resistance of the sample yielded by being left unattended for 48 hours, while being slightly higher than the contact resistance of the sample yielded by performing both treatment and the subsequent washing with water, was considerably lower than the contact resistance of the rest of the samples, including the sample yielded without performing treatment.

Meanwhile, while data indicates that the sample yielded by performing dry etching by mainly using Ar had low contact resistance, the contact resistance of the sample is expected to increase once again after being left unattended in ambient air, due to the forming of a new $AlO_x$.

According to the above, low contact resistance can be achieved by forming, an intermediate layer containing Al, O, and F at a surface portion of a drain electrode. Further, particularly low contact resistance can be achieved by reducing the thickness of the intermediate layer to 5 nm or less through washing with water.

2. Composition of Intermediate Layer and Pre-Connection Treatment

The following describes the composition of intermediate layers corresponding to different methods of pre-connection treatment with reference to FIG. 9A and FIG. 9B, through comparison with the sample yielded without performing treatment (FIG. 9C), which corresponds to the state illustrated in part (d) of FIG. 6.

As illustrated in FIG. 9A, the intermediate layer in the sample yielded by performing treatment but without performing the subsequent washing with water contained, at a surface portion thereof, less oxygen (O) and more fluorine (F) compared to the sample yielded without performing treatment illustrated in FIG. 9C. In particular, high fluorine (F) content is observed within a depth of 2 nm from the outermost surface. Further, the intermediate layer in the sample yielded by performing treatment but without performing the subsequent washing with water contained, at a surface portion thereof, only a trace level of oxygen (O).

Meanwhile, as illustrated in FIG. 9B, the intermediate layer in the sample yielded by performing both treatment and the subsequent washing with water contained much fluorine (F) at a surface portion thereof, while the amount of fluorine (F) was less than that in the sample illustrated in FIG. 9A. Further, the intermediate layer in the sample yielded by performing both treatment and the subsequent washing with water contained, at a surface portion thereof, slightly more oxygen (O) compared to the sample illustrated in FIG. 9A.

3. How Dry Etching Conditions and Whether or Not Washing With Water is Performed Affect Contact Resistance The following describes how different conditions applied in the dry etching and whether or not washing with water is performed affect the contact resistance, with reference to FIG. 10A and FIG. 10B.

FIG. 10A illustrates ten samples prepared by varying the conditions applied in the dry etching and by varying whether or not washing with water is performed. Specifically, the dry etching was performed using one of three levels of power, using one of two levels of pressure, and using one of three different processing durations. Further, FIG. 10B is a graph illustrating the results yielded by measuring the contact resistance of each of the ten samples.

(1) Processing Duration Dependency

The dry etching conditions applied for samples S01, S02, S03 differed only in terms of processing duration. As illustrated in FIG. 10A and FIG. 10B, the contact resistance of sample S01, for which dry etching was performed for a relatively short 5-second duration, was at least $10^2$ times greater the contact resistance of each of samples S02 and S03. Further, the dry etching conditions applied for samples S04 and S05 also differed only in terms of processing duration. The contact resistance of sample S04, for which dry etching was performed for a relatively short 5-second duration, was greater than the contact resistance of sample S05.

Based on the above results, an assumption can be made that dry etching performed for a relatively short duration of 5 seconds results in relatively high contact resistance between a drain electrode and an anode due to not being capable of completely removing an $ALO_x$ film formed at a surface portion of the drain electrode.

(2) Power Dependency

The dry etching conditions applied for samples S03, S05, S06 differed only in terms of power. As illustrated in FIG. 10A and FIG. 10B, the contact resistance of each of samples S03 and S06, for which dry etching was performed with relatively high power, was lower than the contact resistance of sample S05, for which dry etching was performed with relatively low power (Source 250 W/Bias 200 W). These results indicate that the higher the power applied in dry etching, the lower the contact resistance. However, an assumption is made that even when performing dry etching with low power, low contact resistance can be achieved by performing dry etching for an extended duration.

(3) Pressure Dependency

The dry etching conditions applied for samples S03 and S10 differed only in terms of pressure. As illustrated in FIG. 10A and FIG. 10B, the contact resistance of sample S10, for which dry etching was performed with a relatively high pressure of 30 mTorr, was greater than the contact resistance of sample S10. An assumption is made that high pressure in dry etching results in high contact resistance due to not being capable of causing fluorine-based plasma to be generated near the substrate surface. Accordingly, dry etching is beneficially performed with low pressure in order to promote reaction.

(4) Whether or Not Washing With Water is Performed

Samples S07, S08, and S09 were prepared without performing washing with water, whereas the rest of the samples were prepared by performing washing with water. As FIG. 10A and FIG. 10B, the contact resistance of each of samples S07 through S09, for which washing with water was not performed, was higher than the contact resistance of the rest of the samples, including samples S03 and S05. This indicates that reducing the thickness of the intermediate layer through treatment such as washing with water is very beneficial for achieving low contact resistance.

4. Ratio of Al/F/O Based on Work Function Data

Figure 11A:
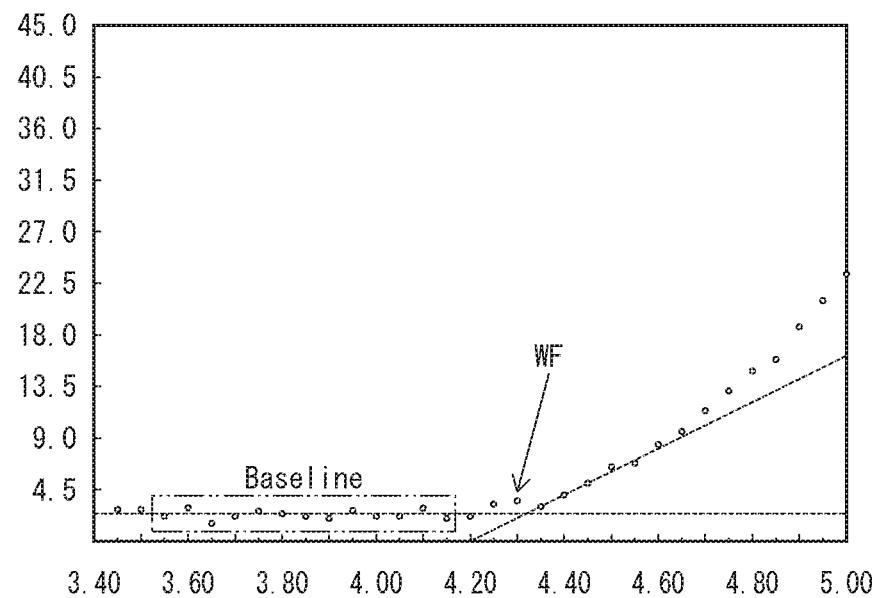
FIG. 11A is a graph illustrating a sample of work function data.

FIG. 11A illustrates work function data samples. As illustrated in FIG. 11A, a "Baseline" is where photoelectrons are equal to or lower than the Fermi level. Further, "Baseline" and work function values are dependent upon surface material.

Figure 11B:
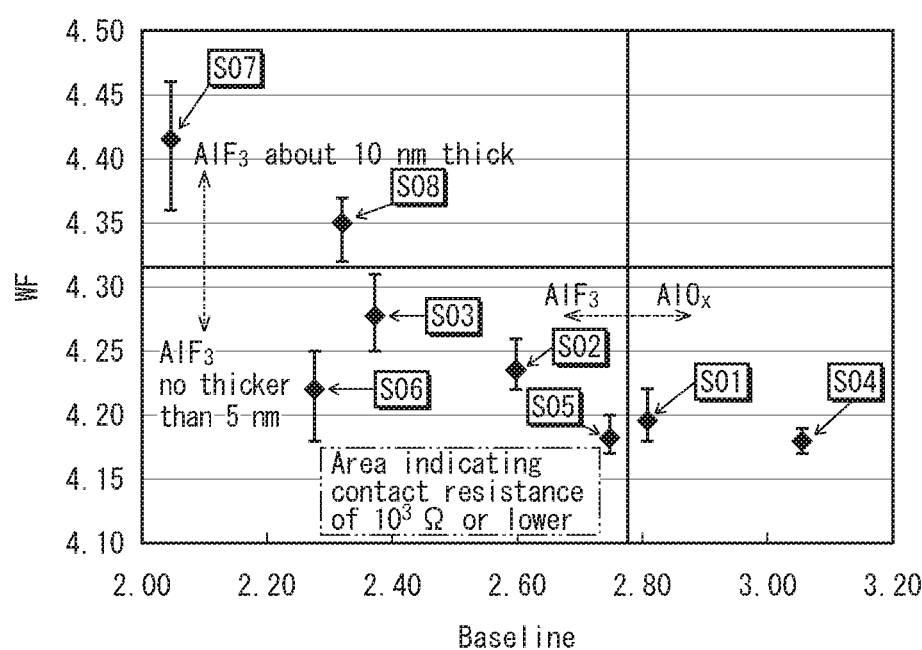
FIG. 11B is a characteristic graph illustrating, for each sample, a relationship between a work function (WF) value and a "Baseline" value.

FIG. 11B illustrates that samples S07 and S08, for which washing with water was not performed, had high work function (WF) values.

Meanwhile, FIG. 11B illustrates that samples S01 and S04, for which dry etching was performed for a relatively short duration, had high "Baseline" values.

Note that FIG. 11B includes plotted data for samples S01 through S08 and does not include data for sample S09 and S10.

The results illustrated in FIG. 11B indicate that the conditions for samples S02, S03, S05, and S06 are beneficial for achieving low contact resistance.

FIG. 12 compares the stoichiometric ratio data for samples No. 1 and No. 2, which differ in terms of whether or not washing with water was performed, with respect to stoichiometric ratio data for sample No. 3 yielded without performing any treatment. Note that data for each of the samples were acquired through Auger electron spectroscopy (AES).

FIG. 12 illustrates that the fluorine (F) content ratio for sample No. 1, which was yielded without performing washing (washing with water), was 3.3 times the fluorine (F) content ratio for sample No. 3, and the oxygen (O) content ratio for sample No. 1 was 0.1 times the oxygen (O) content ratio for sample No. 3.

Meanwhile, FIG. 12 illustrates that the fluorine (F) content ratio for sample No. 2, which was yielded by performing washing (washing with water), was 2.8 times the fluorine (F) content ratio for sample No. 3, and the oxygen (O) content ratio for sample No. 2 was 0.3 times the oxygen (O) content ratio for sample No. 3.

Figure 13A:
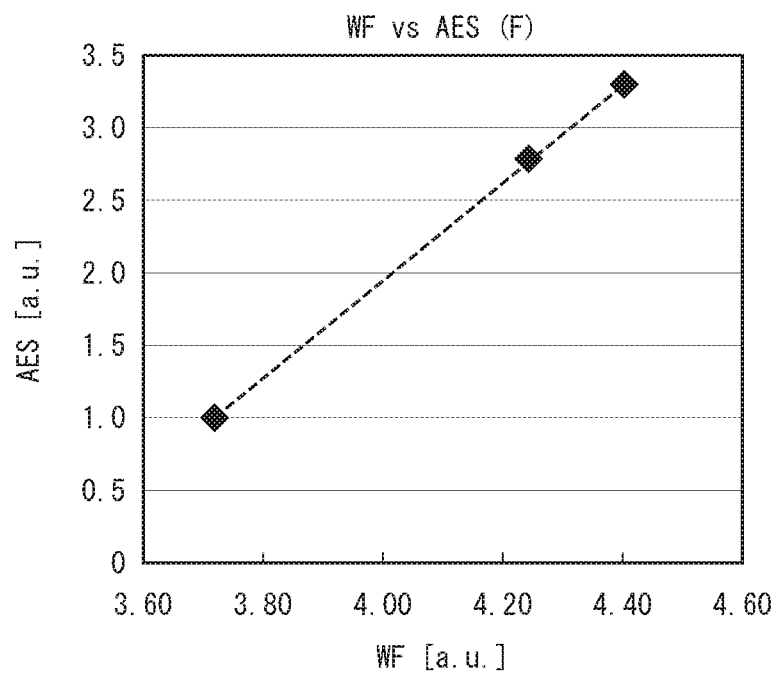
FIG. 13A is a characteristic graph illustrating, for each of the three samples, a relationship between a WF value and an AES(F) value.
Figure 13B:
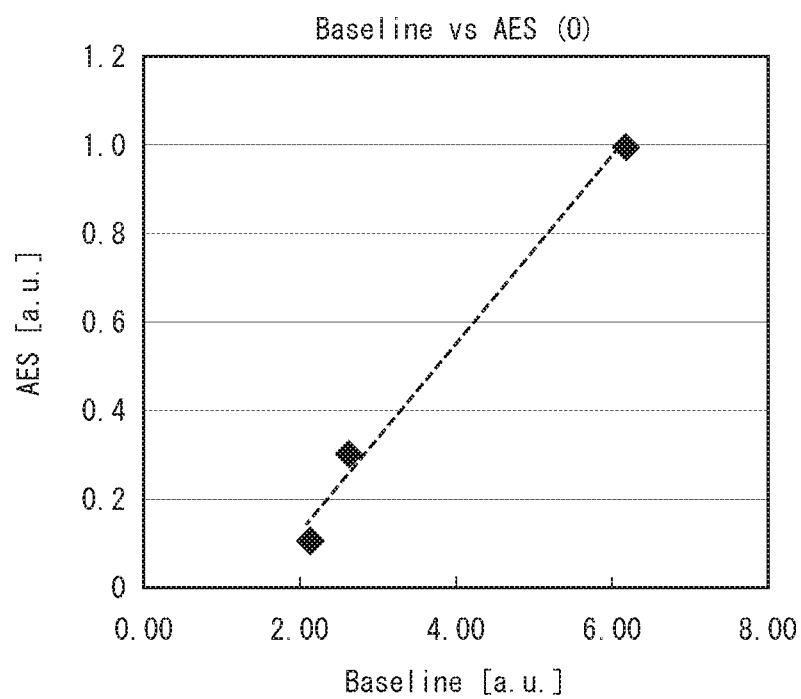

Further, FIG. 13A illustrates the relationship between WF values and AES(F) values, and FIG. 13B illustrates the relationship between "Baseline" values and AES(O) values. FIG. 13A and FIG. 13B are based on the data illustrated in FIG. 11 and FIG. 12.

In FIG. 13A, in which WF values are plotted on the horizontal axis and AES(F) values are plotted on the vertical axis, an approximate straight line representable as follows can be drawn.

$$AES(F)\text{value} = 3.3685 \times WF\text{ value} - 11.525 \quad \text{[Math 1]}$$

In FIG. 13B, in which "Baseline" values are plotted on the horizontal axis and AES(F) values are plotted on the vertical axis, an approximate straight line representable as follows can be drawn.

$$AES(O)\text{value} = 0.2128 \times \text{"Baseline" value} - 0.3098 \quad \text{[Math 2]}$$

Figure 14A:
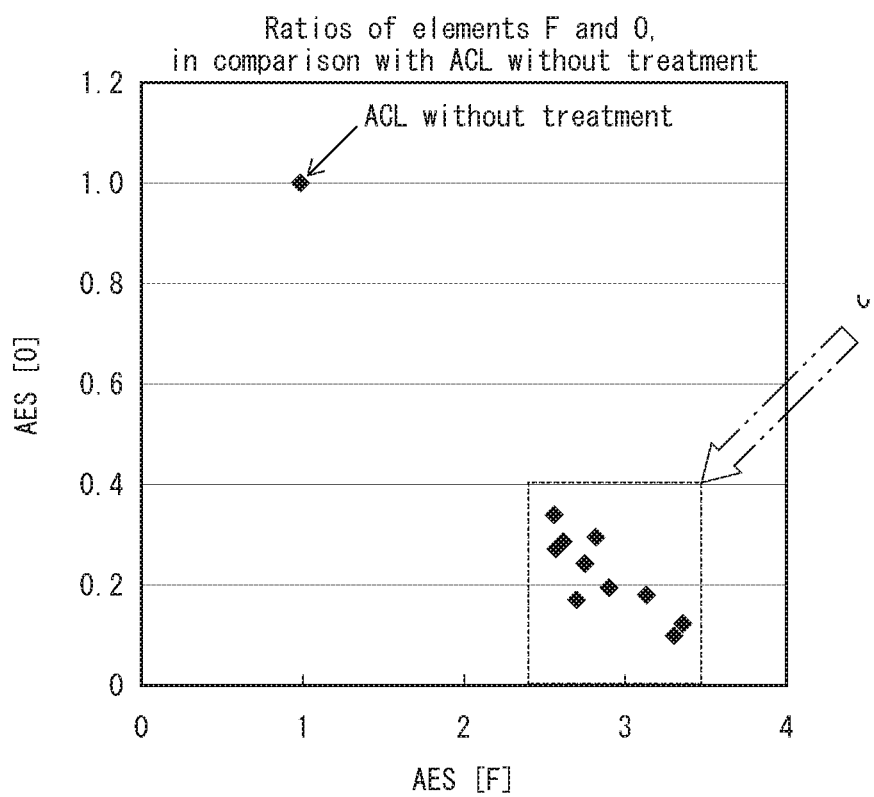
FIG. 14A is a characteristic graph illustrating ratios between F and O for various samples, in comparison with the ratio between F and O for an aluminum alloy without treatment.

FIG. 14A is based on the data illustrated in FIG. 13A, the data illustrated in FIG. 13B, [Math 1], and [Math 2]. FIG. 14A illustrates ratios between fluorine (F) values for intermediate layers and a fluorine (F) value for an Al alloy (e.g., an Al—Co alloy) without treatment, and ratios between oxygen (O) values for intermediate layers and an oxygen (O) value for the Al alloy without treatment.

As illustrated in FIG. 14A (part indicated by arrow C), the AES(F) values for samples yielded by performing treatment were within a range of 2.5 to 3.4 times the AES(F) value for the Al alloy without treatment (i.e., a sample having an oxidation film ($AlO_x$ film) formed at a surface portion thereof), and the AES(O) values for samples yielded by performing treatment were within a range of 0.1 to 0.4 times the AES(O) value for the Al alloy without treatment. Note that in FIG. 14A, 1.0 is assigned as the AES(F) value and the AES(O) value for the Al alloy without treatment, and the other AES(F) values and AES(O) values are relative values based on the value (1.0) for the Al alloy without treatment.

Figure 14B:
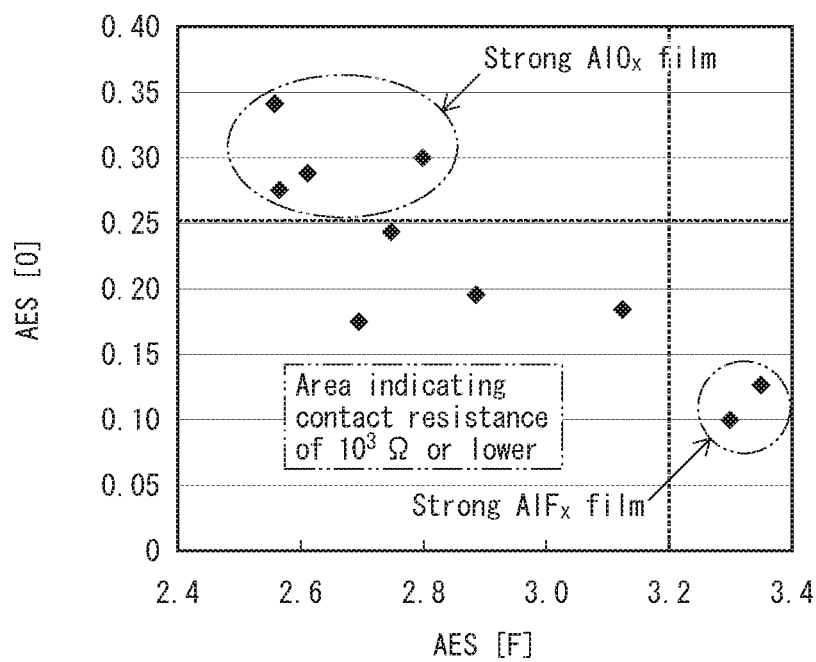
FIG. 14B is a graph illustrating a portion of FIG. 14A indicated by arrow C in magnified state.

Within the part of FIG. 14A indicated by arrow C, which is shown in detail in FIG. 14B, AES(F) values and AES(O) values vary depending upon treatment performed. For example, FIG. 14B defines that AES(O) values no greater than 0.25 and AES(F) values no greater than 3.2 achieve a contact resistance no greater than $10^3 \Omega$. For example, when the AES(O) value is greater than 0.25, a strong $AlO_x$ film is formed and thus a low contact resistance is difficult to achieve, and when the AES(F) value is greater than 3.2, a strong $AlF_3$ film is formed and thus a low contact resistance is difficult to achieve.

Nevertheless, the contact resistance between TFT drain electrodes and anodes needs to realize a good balance between the injection of electrons from the cathode to the light-emitting layers and the injection of holes from the anodes to the light-emitting layers. Thus, a desirable level of contact resistance is to be uniquely specified for each device. Accordingly, ranges of AES(F) and AES(O) in an intermediate layer can be specified based on the optimum contact resistance of the manufacture-target device.

[Modification 1]

Figure 15A:
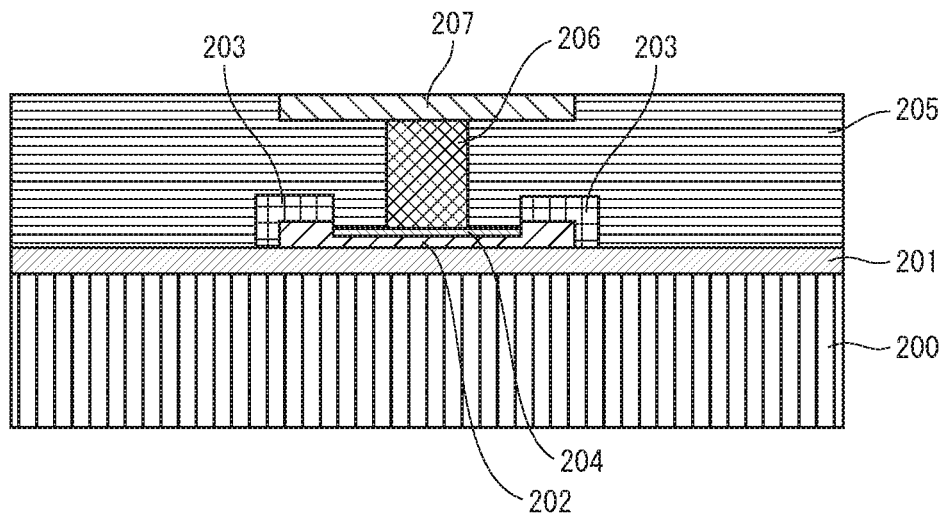
FIG. 15A is a schematic cross-sectional view illustrating an electrical connection structure in an electronic device pertaining to modification 1.

The following describes the structure of a part of an electronic device pertaining to modification 1, with reference to FIG. 15A.

The electronic device illustrated in FIG. 15A includes a substrate 200 having formed therein a bipolar transistor such as an insulated gate bipolar transistor (IGBT), a metal-oxide semiconductor field-effect transistor (MOS-FET), and the like (which are not illustrated in FIG. 15A). Further, the electronic device includes an electrically-insulating layer 201 disposed on the upper surface of the substrate 200, and a wiring layer 202 disposed on the electrically-insulating layer 201 covering a part of the electrically-insulating layer 201.

The wiring layer 202 is composed of aluminum (Al) or an Al alloy, and is formed by forming a film of such material on the electrically-insulating layer 201 through sputtering or vacuum vapor deposition, and pattering the film through dry etching, for example.

A protection layer 203 covers parts of a surface of the wiring layer 202. The protection layer 203 is composed of $Al_2O_3$, SiN, $SiO_x$, or the like, and is formed by oxidizing surface portions of what is to become the wiring layer 202 before completing the forming of the wiring layer 202. Meanwhile, the protection layer 203 has an opening in which an intermediate layer 204 is disposed.

Similar to the intermediate layer 103, the intermediate layer 204 contains aluminum (Al), fluorine (F), and oxygen (O). Further, the intermediate layer 204 has a thickness and an in-layer fluorine-oxygen ratio similar to those of the intermediate layer 103.

Further, a planarizing layer 205 is disposed through deposition to cover parts of the electrically-insulating layer 201, the protection layer 203, and the intermediate layer 204. The planarizing layer 205 has a contact hole formed therein at a part thereof over a part of the intermediate layer 204. The contact hole is plugged up with a plug 206 composed of an electrically-conductive material (e.g., a metal material such as Al, an Al alloy, or W).

Further, the planarizing layer 205 has a recessed part at an upper surface thereof, in which a wiring layer 207 is disposed. For example, the wiring layer 207 is formed by performing a Damascene process with a metal material such as Al, an Al alloy, Au, or Cu.

This modification also involves forming an intermediate layer (the intermediate layer 204). Forming the intermediate layer achieves low contact resistance between the plug 206 and the wiring layer 202 composed of Al or an Al alloy, and thus achieves excellent device characteristics.

[Modification 2]

Figure 15B:
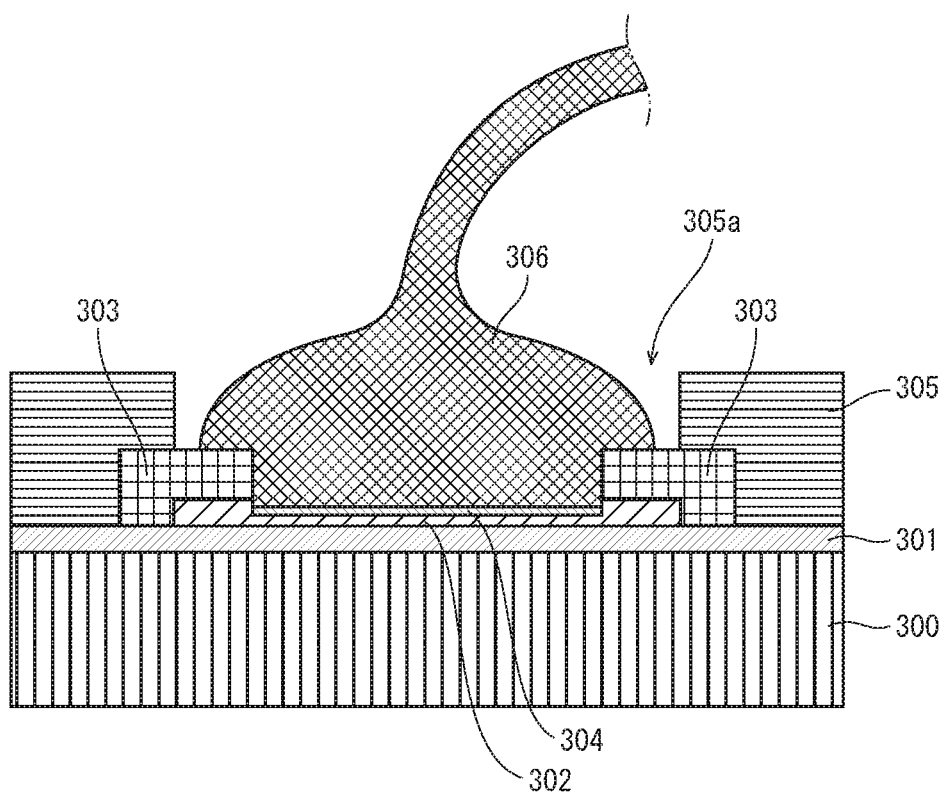
FIG. 15B is a schematic cross-sectional view illustrating an electrical connection structure in an electronic device pertaining to modification 2.
Figure 16:
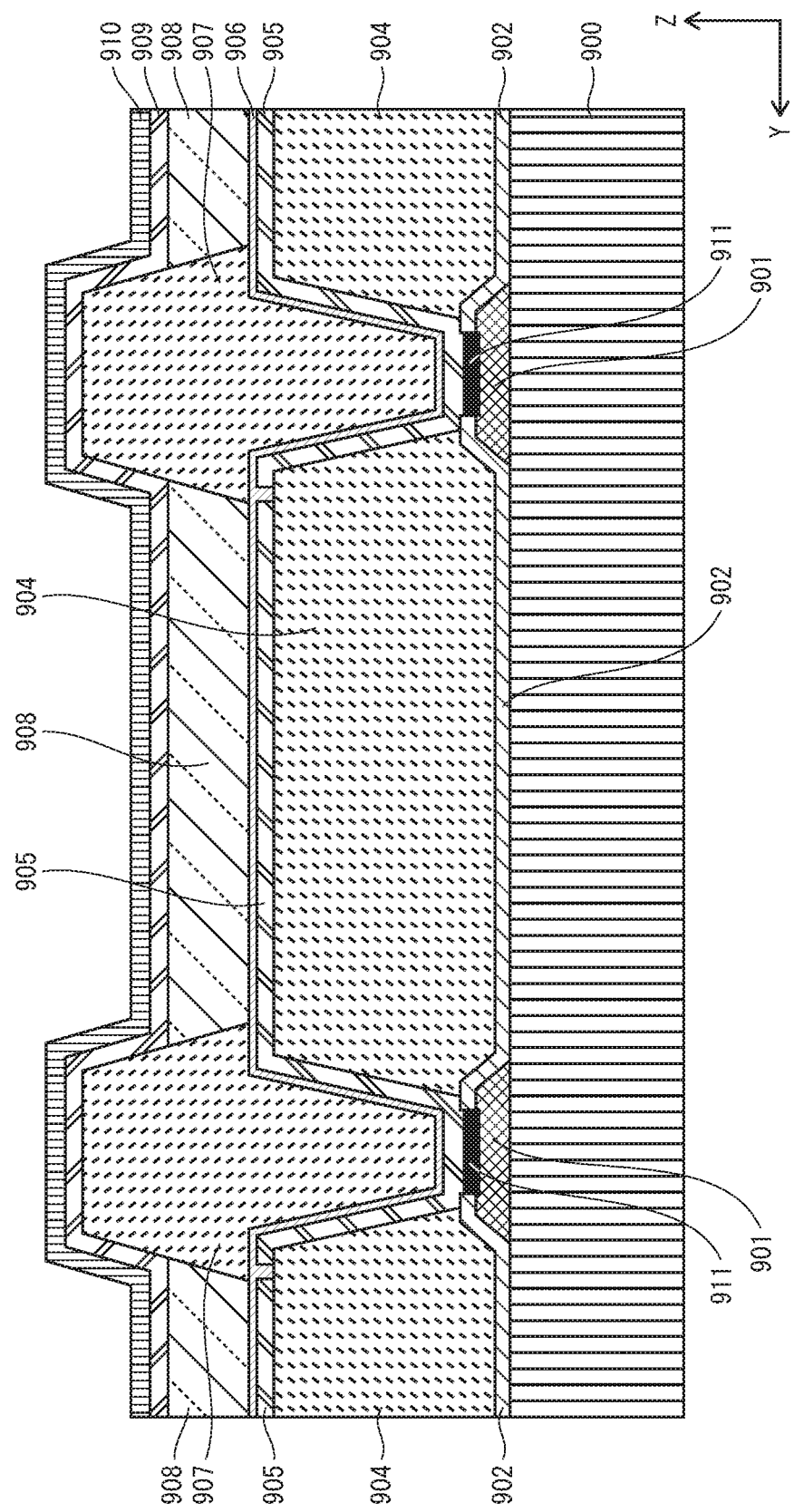
FIG. 16 is a cross-sectional view illustrating the structure of a part of a display panel pertaining to conventional technology.

The following describes the structure of a part of an electronic d pertaining to modification 2, with reference to FIG. 15B.

Similar to the electronic device pertaining to modification 2, the electronic device illustrated in FIG. 15B includes a substrate 300 having formed therein a bipolar transistor, a MOS-FET, and the like (which are not illustrated in FIG. 15B). Further, similar to modification 1, the electronic device includes an electrically-insulating layer 301 disposed on the upper surface of the substrate 300.

The electronic device pertaining to the present modification further includes a pad 302 disposed on a part of the electrically-insulating layer 301. The pad 302 is composed of Al or an Al alloy, and is formed by using a method similar to that used for forming the wiring layer 202 in modification 1. Further, peripherals part of a surface of the pad 302 are covered with a protection layer 303. The protection layer (the protection layer 303) is similar to that in modification 1 for being composed of $Al_2O_3$, SiN, $SiO_x$, or the like. Further, an intermediate layer 304 is disposed over a part of the pad 302 that is not covered with the protection layer 303.

Similar to the embodiment and modification 1, the intermediate layer (the intermediate layer 304) contains aluminum (Al), fluorine (F), and oxygen (O). Further, the intermediate layer 304 has a thickness and an in-layer fluorine-oxygen ratio similar to those of the intermediate layers in the embodiment and modification 1.

Further, a cover layer 305 is disposed through deposition to cover parts of the electrically-insulating layer 301 and the protection layer 303. The cover layer 305 has an opening (opening 305a) formed therein at a part thereof over the pad 302. The opening 305a exposes the intermediate layer 304 at the bottom thereof, to allow a bonding wire 306 to be connected to the intermediate layer 304.

The bonding wiring 306 contains gold (Au) for example, and is electrically-connected to the pad 302 via the intermediate layer 304. This modification also involves disposing an intermediate layer (the intermediate layer 304) containing aluminum (Al), fluorine (F), and oxygen (O). Disposing the intermediate layer achieves low contact resistance between the bonding wire 306 and the pad 302 composed of Al or an Al alloy, and thus achieves excellent device characteristics.

Other Matters

The embodiment provides structural description based on a structure where an intermediate layer is disposed at an area of an organic EL panel where a TFT drain electrode and an anode are electrically connected. Meanwhile, modifications 1 and 2 provide structural description based on a structure where an intermediate layer is disposed at an area of an electronic device that is not an organic EL panel where electrically-conductive layers are electrically connected.

However, the present invention is also applicable to structures other than those described in the embodiment and modifications 1 and 2, and is applicable to various structures where two electrically-conductive layers, one of which is composed of Al or the like, are electrically connected. For example, the present invention is applicable to a structure where two parallel electrically-conductive layers disposed along a substrate main surface are electrically connected. That is, the two electrically-conductive layers between which the intermediate layer is disposed need not be stacked one on top of another in the substrate thickness direction, and may be disposed spaced away along a direction intersecting the substrate thickness direction. The intermediate layer containing aluminum (Al), fluorine (F), and oxygen (O), when disposed between such electrically-conductive layers, also achieves the effects described above.

Further, the embodiment describes a display panel in which an anode is disposed close to the substrate and a cathode is disposed close to the top side of the display panel. However, the positional arrangement of the anode and the cathode may be reversed. When making such a modification, disposing the intermediate layer where a cathode and TFT source/drain electrode are electrically connected achieves the effects described above.

Further, the drawings do not include any specific illustration of the path through which power is supplied to the cathode in the display panel pertaining to the embodiment. Power may be supplied to the cathode by disposing bus-bars one for each pixel or each set of several pixels, and by electrically connecting the bus-bars and the cathode. This connection prevents voltage drop from occurring in the panel at the cathode. In addition, when each of such bus-bars is composed of Al or the like for example, the intermediate layer described above may be disposed between the bus-bar and the cathode, whereby the effects described above are achieved.

Further, the embodiment describes performing washing with water to reduce the thickness of the intermediate layer. However, other methods are applicable for reducing the thickness of the intermediate layer. For example, etching may be performed while using a solution other than water as the etchant. Alternatively, the thickness of the intermediate layer may be reduced by performing dry etching, which involves use of a gas.

Further, the intermediate layer need not be disposed with respect to an electrically-conductive layer composed of Al or the like without any other element existing between the intermediate layer and the electrically-conductive layer. That is, the intermediate layer may be disposed with respect to an electrically-conductive layer composed of Al or the like with island-like remnants of an $AlO_x$ film existing between the intermediate layer and the electrically-conductive layer. Even in such a case, the intermediate layer achieves lower contact resistance compared to the conventional structure where a complete $AlO_x$ film exists between the electrically-conductive layers.

Further, the intermediate layer needs to contain at least aluminum (Al) and fluorine (F), whereas the intermediate layer not necessarily contains oxygen. That is, the intermediate layer may be made of $AlF_x$ (e.g., $AlF_3$).

Further, the intermediate layer beneficially has a thickness of 5 nm or less as described above. However, it should be noted that even without reducing the thickness of the intermediate layer, the intermediate layer achieves lower contact resistance compared to when treatment is not performed (i.e., when an $AlO_x$ film is formed at a surface), as illustrated in FIG. 8.

INDUSTRIAL APPLICABILITY

The present invention is useful for achieving low contact resistance between an electrically-conductive layer composed of Al or the like and another electrically-conductive layer in an electronic device and thereby achieving an electronic device with high performance.

REFERENCE SIGNS LIST

1 display device
10 display panel
20 driving control unit
21-24 driving circuit
25 control circuit
100, 200, 300 substrate
101, 1010, 1011 drain electrode
102, 1020 barrier layer
103, 204, 1030 intermediate layer
104, 205, 1040 planarizing layer
105 anode
106 hole injection layer
107 bank
108 light-emitting layer
109 cathode
110 sealing layer
111 $AlO_x$ film
201, 301 insulating layer
202, 207 wiring layer
203, 303 protection layer
206 plug
302 pad
305 cover layer
306 bonding wiring

The invention claimed is:

1. An electronic device, comprising:
a substrate;
a first electrically-conductive layer disposed on the substrate and composed of aluminum or an aluminum alloy;
a second electrically-conductive layer spaced away from the first electrically-conductive layer;
an intermediate layer disposed between the first electrically-conductive layer and the second electrically-conductive layer and in direct electrical and physical contact with both the first electrically-conductive layer and the second electrically-conductive layer; and
a barrier layer covering a surface of the first electrically-conductive layer,
wherein the barrier layer covers the surface of the first electrically-conductive layer other than a part of the surface of the first electrically-conductive layer that is in contact with the intermediate layer, and
wherein the intermediate layer contains aluminum and fluorine.

2. The electronic device of claim 1,
wherein the intermediate layer further contains oxygen.

3. The electronic device of claim 1,
wherein the intermediate layer has a thickness of 5 nm or less.

4. The electronic device of claim 1, further comprising:
an electrically-insulating layer deposited over the barrier layer to surround the intermediate layer,
wherein the second electrically-conductive layer contacts the intermediate layer in an opening over the intermediate layer that is defined by the electrically-insulating layer.

5. The electronic device of claim 1,
wherein the second electrically-conductive layer is composed of aluminum or an aluminum alloy.

* * * * *